United States Patent
Rietzler et al.

(10) Patent No.: US 9,627,324 B2
(45) Date of Patent: Apr. 18, 2017

(54) APPARATUS AND METHOD FOR PROCESSING A SUBSTRATE

(75) Inventors: Wolfgang Rietzler, Bludenz (AT); Bart Scholte Van Mast, Azmoos (CH)

(73) Assignee: EVATEC AG, Trübbach (CH)

( * ) Notice: Subject to any disclaimer, the term of this patent is extended or adjusted under 35 U.S.C. 154(b) by 461 days.

(21) Appl. No.: 12/947,912

(22) Filed: Nov. 17, 2010

(65) Prior Publication Data

US 2011/0117702 A1   May 19, 2011

Related U.S. Application Data

(60) Provisional application No. 61/261,805, filed on Nov. 17, 2009.

(51) Int. Cl.
  *H01L 21/78* (2006.01)
  *H01L 23/538* (2006.01)
  (Continued)

(52) U.S. Cl.
  CPC ........ *H01L 23/5389* (2013.01); *H01L 21/561* (2013.01); *H01L 21/568* (2013.01); *H01L 21/67207* (2013.01); *H01L 21/6835* (2013.01); *H01L 23/147* (2013.01); *H01L 23/3128* (2013.01); *H01L 24/19* (2013.01); *H01L 24/96* (2013.01); *H01L 24/97* (2013.01); *H01L 23/3114* (2013.01); *H01L 2224/0401* (2013.01); *H01L 2224/04105* (2013.01); *H01L 2224/12105* (2013.01); *H01L 2224/20* (2013.01);
  (Continued)

(58) Field of Classification Search
  USPC ......................................... 438/471
  See application file for complete search history.

(56) References Cited

U.S. PATENT DOCUMENTS

| 5,318,752 | A | 6/1994 | Visser |
| 6,454,919 | B1 | 9/2002 | Sundarrajan |
| 6,908,561 | B1* | 6/2005 | Foust et al. ............... 216/13 |
| 6,969,681 | B2 | 11/2005 | Farnworth |
| 7,009,288 | B2 | 3/2006 | Bauer et al. |
| 7,202,107 | B2 | 4/2007 | Fuergut et al. |
| 7,713,786 | B2* | 5/2010 | Foster et al. ............ 438/115 |

(Continued)

FOREIGN PATENT DOCUMENTS

| CN | 1386105 A | 12/2002 |
| JP | 09-275139 A | 10/1997 |

(Continued)

OTHER PUBLICATIONS

International Search Report for PCT/IB2010/055226 dated May 20, 2011.

(Continued)

*Primary Examiner* — Fernando L Toledo
*Assistant Examiner* — Valerie N Newton
(74) *Attorney, Agent, or Firm* — Pearne & Gordon LLP

(57) ABSTRACT

A method of processing a substrate that displays out-gassing when placed in a vacuum comprises placing the substrate in a vacuum and performing an out-gassing treatment by heating the substrate to a temperature T1 and removing gaseous contamination emitted from the substrate until the out-gassing rate is determined by the diffusion of the substrate's contamination and thus essentially a steady state has been established. Afterwards, the temperature is lowered to a temperature T2 at which the diffusion rate of the substrate's contamination is lower than at T1. The substrate is further processed at said temperature T2 until the substrate has been covered with a film comprising a metal.

21 Claims, 24 Drawing Sheets

(51) Int. Cl.
  *H01L 21/56* (2006.01)
  *H01L 21/67* (2006.01)
  *H01L 21/683* (2006.01)
  *H01L 23/14* (2006.01)
  *H01L 23/00* (2006.01)
  *H01L 23/31* (2006.01)

(52) U.S. Cl.
  CPC ...... *H01L 2224/92* (2013.01); *H01L 2224/97* (2013.01); *H01L 2924/014* (2013.01); *H01L 2924/01005* (2013.01); *H01L 2924/01006* (2013.01); *H01L 2924/01013* (2013.01); *H01L 2924/01033* (2013.01); *H01L 2924/01047* (2013.01); *H01L 2924/01075* (2013.01); *H01L 2924/01082* (2013.01); *H01L 2924/10253* (2013.01); *H01L 2924/12041* (2013.01); *H01L 2924/12044* (2013.01); *H01L 2924/14* (2013.01); *H01L 2924/15311* (2013.01); *H01L 2924/181* (2013.01); *H01L 2924/18162* (2013.01); *H01L 2924/3025* (2013.01); *H01L 2924/3511* (2013.01)

(56) References Cited

U.S. PATENT DOCUMENTS

| | | |
|---|---|---|
| 2002/0000194 A1 | 1/2002 | Clarke |
| 2005/0106855 A1* | 5/2005 | Farnworth ............... 438/622 |
| 2006/0042755 A1 | 3/2006 | Holmberg et al. |
| 2006/0183269 A1 | 8/2006 | Fuergut |

FOREIGN PATENT DOCUMENTS

| | | |
|---|---|---|
| JP | 2002-511654 A | 4/2002 |
| JP | 2002-324829 A | 11/2002 |
| JP | 2009-016882 A | 1/2009 |
| WO | 02/02445 A1 | 1/2002 |

OTHER PUBLICATIONS

Written Opinion for PCT/IB2010/055226 dated May 20, 2011.
Office Action issued in corresponding Chinese Patent Application No. 201080052142.2 dated Aug. 12, 2014.
Chinese Office action for 201410361067.8 dated May 4, 2016.

* cited by examiner

Flat  Cylindrical  Spherical  Saddle

APPARATUS AND METHOD FOR PROCESSING A SUBSTRATE

BACKGROUND

Some substrates, when placed in a vacuum, display out-gassing during which gaseous matter is emitted from the substrate. This gaseous matter may contaminate the processing equipment and also portions of the substrate itself which is undesirable. Substrates which include organic compounds tend to display out-gassing when placed in a vacuum.

Semiconductor chips are typically provided in a package which includes an organic compound such as a plastic molding compound. The package protects the semiconductor chip which was sawn from a wafer and also provides the link between the semiconductor material's contacts and the external contact areas of the package by which the package is mounted onto a higher level rewiring substrate such as a printed circuit board.

As the complexity of circuits increases, so too does the number of contacts, and this means new types of package are required. The necessary contacts for simple chips can be accommodated just along the edges of the package, but the whole of the base of the package is needed for complex chips. Contacts can take the form of pins or of balls arranged in a matrix pattern. Sometimes a chip is so complex that the package actually has to be larger than is necessary for the chip alone in order to squeeze in all of the contacts.

Some types of packaging, such as that disclosed in U.S. Pat. No. 7,009,288, use a rewiring substrate in the form of prefabricated rewiring board onto which the semiconductor chip is mounted before being electrically connected to the rewiring substrate by bond wires or solder balls, for example. The semiconductor chip and the electrical connections are usually embedded in a plastic composition which forms the housing of the package and protects the semiconductor chip and the electrical connections from the environment.

eWLB (embedded wafer-level ball grid array) technology can match the package to the space required for the balls irrespective of the size of the actual chip, which means packages that are barely any larger than the silicon chip itself. This type of packaging may be provided by first embedding a plurality of semiconductor chips in a plastic housing composition to form a composite wafer and then afterwards depositing a rewiring structure on the composite wafer to provide the electrical connections from the chip contact pads to external contact pads of the package. An example of such a method is disclosed in U.S. Pat. No. 7,202,107.

However, improvements to apparatus and methods for processing a substrate that displays out-gassing, such as a composite wafer, are desirable.

SUMMARY

Apparatus and methods for processing substrates which show extended levels of organic or other out-gassing are provided. Furthermore, the implementation of the apparatus and methods using single semiconductor wafer, high purity equipment is provided. The substrate may be a semiconductor wafer comprising a layer of organic material such as a polyimide layer. The substrate may also be partly formed from the organic material.

DETAILED DESCRIPTION

Figure 2A:
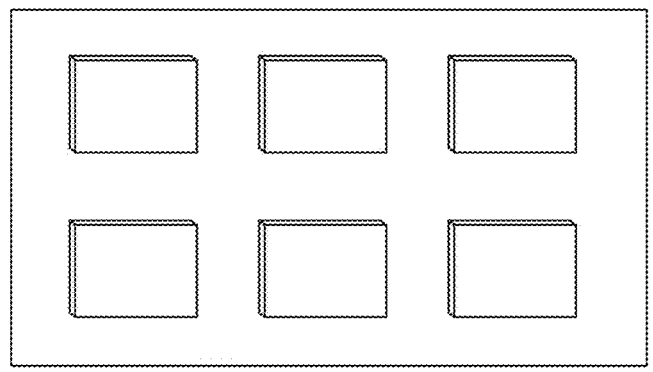
FIG. 2a illustrates a bumping pattern

A method of processing a substrate that displays out-gassing when placed in a vacuum is provided. The substrate is placed in a vacuum and an out-gassing treatment is performed by heating the substrate to a temperature T1 and removing gaseous contamination emitted from the substrate until the out-gassing rate is determined by the diffusion of the substrate's contamination and thus essentially a steady state has been established. Afterwards the temperature is lowered to a temperature T2 at which the diffusion rate of the substrate's contamination is lower than at T1. The substrate is further processed at said temperature T2 until the substrate has been covered with a film comprising a metal.

According to this method, the out-gassing rate is not lowered down to the minimum, but a balance is established, i.e. a steady state at a temperature T1 in which the out-gassing rate is determined solely by the diffusion rate. In other words, the substrate's bulk continuously produces gas and it is continuously pumped. Substrate surface contamination and chamber contamination do not contribute to the out-gassing.

By subsequently lowering the ambient temperature to T2, the diffusion rate is lowered. This has the effect that the pump power is sufficient to guarantee a low level overall contamination, although etching, metal deposition with additional working gases takes place. Therefore the substrate is further processed at T2 until surface is covered by a metal film so as to avoid raising the temperature which would again increase the out-gassing rate.

The diffusion rate depends on temperature by around the sixth power for some substrates.

The difference between T1 and T2 may be at least 100K. T1 may be 150° C. and T2 may be 20° C., for example.

In a further embodiment, the substrate is maintained at a temperature of T2 or less during the further processing of the substrate.

The further processing of the substrate may comprise one or more of etching the substrate and depositing one or more metal layers onto the substrate.

The substrate that displays out-gassing when placed in a vacuum may have many forms. In a first embodiment, the substrate is a semiconductor wafer comprising a layer of organic material. The organic material may comprise a polyimide layer arranged on the front surface of the semiconductor wafer. The semiconductor wafer may be a silicon wafer.

In further embodiments, at least portions of one or more of the front side and the rear side of the substrate comprise organic material. The substrate may be formed from organic material. In one embodiment, the substrate is a composite wafer that comprises a plurality of semiconductor chips embedded in a common plastic composition. At least contact pads of the semiconductor chips are exposed in a first major surface of the composite wafer. The metal layer is deposited onto the first major surface of the composite wafer. This metal layer may be subsequently structured to produce a rewiring structure for the individual electronic components singulated from the composite wafer. This type of substrate is also known as an embedded wafer level ball grid array (eWLB) substrate.

In an embodiment, the composite wafer is placed in a chamber, heated to a temperature T1 and the chamber pumped with a vacuum pump to remove the gaseous matter emitted from the composite wafer from the chamber. Optionally, a gas flow may be applied to the composite wafer whilst pumping the chamber to increase the removal rate.

The gaseous matter emitted from the composite wafer may be trapped in a cold trap positioned in a pumping line leading to a pump. This prevents damage and/or contamination of the pump by the gaseous matter.

End point detection techniques may be used to determine that the composite wafer has been sufficiently out-gassed. The gaseous matter removed from the composite wafer may be monitored and presence of one or more of the compounds such as water ($H_2O$), carbon dioxide ($CO_2$) or hydrocarbons ($C_xH_y$) identified.

Before depositing the first metal layer, a cleaning treatment may be carried out at temperature T2. A cleaning treatment can be used to improve the adhesion of the first metal layer to the contact pads positioned on the active surface of the semiconductor chip. The cleaning treatment may be an etching treatment.

In order to maintain the temperature of the composite wafer at the desired low temperature, the composite wafer may be actively cooled during the cleaning treatment and/or during deposition of the first metal layer. Active cooling may be performed by cooling a chuck on which the composite wafer is positioned.

The first metal layer may be deposited by physical vapour deposition such as a sputtering technique, for example pulsed dc sputtering. If dc sputtering is used, an RF bias may be applied to a chuck supporting the panel. This can aid in the deposition of a homogeneous metal layer onto a bowed substrate.

To reduce contamination from the rear side of the composite wafer during processing of the front side of the composite wafer, a sealing metal layer may be deposited on the rear side of the panel before depositing the first metal layer on the front side of the panel. This sealing metal layer can also acts as a suitable surface onto which an additional heat spreader can be mounted.

In embodiments in which the substrate is a composite wafer, the first metal layer may be subsequently structured to provide one or more of a plurality of conductor tracks, a plurality of contact pads, a plurality of conductor tracks extending from chip contact pads positioned on the active surface of the semiconductor chips to component contact pads and component contact pads positioned on the plastic composition and adjacent the semiconductor chip. The arrangement of the conductor tracks and component contact pads maybe chosen to give the component the desired ball out arrangement and ball pitch.

In a further embodiment, a second metal layer is deposited on the first metal layer and, optionally, a third metal layer is deposited on the second metal layer to provide a multilayer rewiring structure. The metals of the different layers may be different. The lowermost layer may acts as an adhesion layer and the uppermost layer may acts as a low resistance contact layer.

A method of producing an electronic component is also provided in which a substrate in the form of a composite wafer is processed according to one of the embodiments described above and the substrate is singulated to produce one or more electronic components. The electronic component comprises a semiconductor chip embedded in a plastic composition and at least one metal layer positioned on at least one of the semiconductor chip and on the plastic composition.

Apparatus for processing a substrate is provided that comprises two out-gassing stations and at least one processing station. A first out-gassing station includes an airlock comprising means for heating the substrate, a process monitoring sensor. The airlock is coupled to an evacuation system. A second out-gassing station comprises means for heating the substrate, a gas supply positioned to purge a back side of the substrate and a process monitor sensor. The second out-gassing station is also coupled to an evacuation system. At least one subsequent processing station comprises means to actively cool the substrate.

This apparatus is suitable for performing the method according to one of the previously described embodiments, since out-gassing can be performed to achieve a steady state of diffusion from the bulk of the substrate and then the substrate can be cooled to a temperature T2 which is maintained until at least one major surface of the substrate is covered with a metal film. In particular, the out-gassing treatment can be performed within a conventional cluster type multi-station processing system as the in bound airlock is also used for out-gassing. The normal production rate can be maintained and no separate equipment outside of the processing apparatus is required to perform a part, or all, of the out-gassing process.

The means for cooling the substrate may be a cryogenic chuck comprising a heater element. This enables the temperature of the substrate to be controlled over a larger temperature range.

The out-gassing stations and the processing stations may comprise receiving pins arranged to receive a circularly bowed substrate. This embodiment may be used if the substrate to be processed is a composite wafer, since composite wafers tend to display circular bowing.

One or more of the out-gassing stations and the processing stations may further comprise a cold trap to getter gaseous matter emitted from the substrate. This prevents damage and contamination of the vacuum system.

The second out-gassing station and/or the subsequent processing station further comprise a gas line for the supply of oxygen to the station and an RF power supply to a chuck of the second out-gassing station. These features enable in-situ cleaning to be performed.

The first out-gassing station may be the in-bound airlock of a cluster-type multi-station processing apparatus.

This application describes the apparatus and method design considerations for processing substrates which show extended levels of organic or other out-gassing and the implementation of these for single wafer, high purity equipment.

The substrate may be a semiconductor wafer comprising a layer of organic material such as a polyimide layer. The substrate may also be partly formed from the organic material. The following embodiments are described with reference to a substrate in the form of a composite wafer. The composite wafer comprises a plurality of semiconductor chips embedded in a common plastic compound such as a molding compound. A composite wafer may be used for the high volume manufacturing of eWLB FanOut products.

FanOut or Fan-out is a measure of the ability of a logic gate output, implemented electronically, to drive a number of inputs of other logic gates of the same type. In most designs, logic gates are connected together to form more complex circuits, and it is common for one logic gate output to be connected to several logic gate inputs. The technology used to implement logic gates usually allows gate inputs to be wired directly together with no additional interfacing circuitry required.

Die: A die in the context of integrated circuits is a small block of semiconducting material, on which a given functional circuit is fabricated. Typically, integrated circuits are produced in large batches on a single wafer of electronic-grade silicon (EGS) through processes such as photolithography. The wafer is cut ("diced") into many pieces, each containing one copy of the circuit. Each of these pieces is called a die.

FOUP is an acronym for Front Opening Unified Pod. It is a specialized plastic enclosure designed to hold silicon wafers securely and safely in a controlled environment, and to allow the wafers to be removed for processing or measurement by tools equipped with appropriate load ports and robotic handling systems.

UBM is an acronym for under bump metallization. The final metal layer of most IC bond pads is aluminum, providing a satisfactory surface for conventional wire bonding. Unfortunately, this surface is inhospitable to most conductive bumps. Aluminum forms an oxide immediately upon exposure to air, and this native oxide is an electrical insulator. A wire bond in its formation scrubs through the insulating oxide to weld with the underlying metal. Bumps need an alternative strategy for making electrical connection.

Consequently, successful bumping should first replace the oxidized aluminum surface with a more hospitable material, the UBM. This UBM should meet several requirements. It should provide a strong, stable, low resistance electrical connection to the aluminum. It should adhere well both to the underlying aluminum and to the surrounding IC passivation layer, hermetically sealing the aluminum from the environment. The UBM should provide a strong barrier to prevent the diffusion of other bump metals into the IC. The UBM should be readily wettable by the bump metals, for solder reflow. Meeting all these requirements generally requires multiple layers of different metals, such as an adhesion layer, a diffusion barrier layer, a solderable layer, and an oxidation barrier layer.

TWP is the acronym for Thin Wafer Processing

ICP is the acronym for Inductively Coupled Plasma. An inductively coupled plasma (ICP) is a type of plasma source in which the energy is supplied by electrical currents which are produced by electromagnetic induction, that is, by time-varying magnetic fields.

Figure 1:
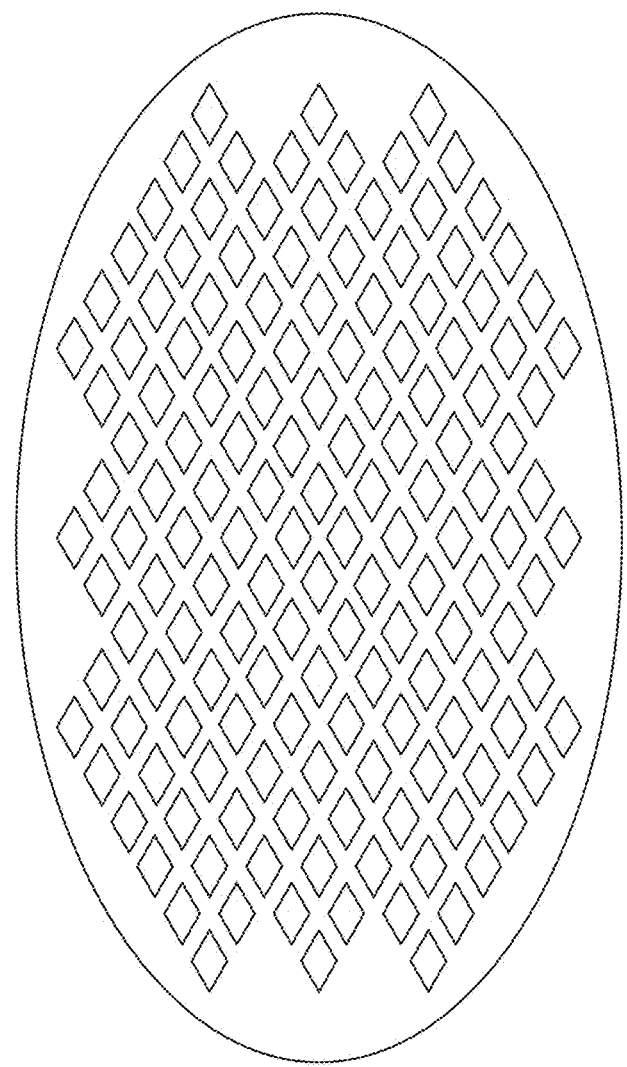
FIG. 1 illustrates a Fan-Out molded substrate or composite wafer
Figure 2B:
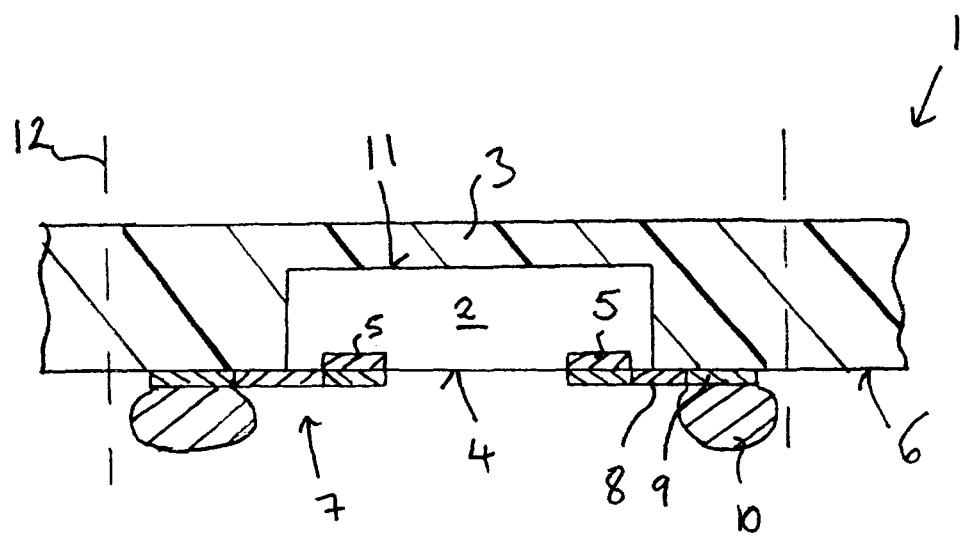
FIG. 2b illustrates a schematic cross-sectional view of a panel according to a first embodiment.

The concepts and evaluation described in this document refer to Oerlikon Clusterline processing equipment used for processing a panel comprising a plurality of semiconductor chips embedded in an organic compound such as a plastic composition. One or more metal layers are deposited onto such a panel to provide a rewiring structure from the chip contact pads to the component contacts pads which may be positioned on the organic compound. This panel is singulated to produced a plurality of packages is also referred to as embedded wafer level ball grid array (eWLB) packages. The concepts are described in detail for processing of substrates with embedded die technologies but can also be applied more generally for any substrate that shows extensive out-gassing. The applicability and functionality however is not limited to a specific processing equipment, but can be usefully applied to other type of equipment.

eWLB or Fan-out substrates are composite substrates where semiconductor dies are embedded in organic compound molds. The technology enables to increase contact areas and to increase product yields. FIG. 1 illustrates a composite wafer comprising a plurality of semiconductor chips embedded in an organic composition. FIG. 2a illustrates the bumping pattern of the solder balls arranged on component contact pads. FIG. 2b illustrates a schematic cross-section view of the panel after processing to deposit the rewiring structure on the composite wafer, thus forming a panel.

FIG. 2b illustrates a cross-sectional view of a portion of a panel 1. The panel 1 comprises a plurality of semiconductor chips 2, of which only one is illustrated in FIG. 2b, embedded in a plastic housing composition 3. Each of semiconductor chips 2 comprises an active surface 4 on which a plurality of chip contact pads 5 are positioned. In this embodiment, the chip contact pads 5 are coplanar with a major surface 6 of the plastic housing composition 3. The panel 1 further comprises a rewiring structure 7 which was fabricated by depositing a metal layer onto the major surface 6 of the plastic housing composition and the active surface 4 of semiconductor chip 2. The rewiring structure 7 includes a plurality of conductor tracks 8 extending from the chip contact pads 5 in a fan-out arrangement so that the distal end of each of the conductor tracks 8 is positioned on the plastic housing compound 3 adjacent the semiconductor chip 2. Each of the distal ends provides an external contact pad 9 on which a solder ball 10 is positioned. In this embodiment, the passive surface 11 of the semiconductor chip is embedded within the plastic housing composition 3.

The panel 1 many singulated along the lines indicated with reference number 12 to produce a plurality of individual packages from the panel 1.

In further non-illustrated embodiments, contact bumps may be positioned on the contact pads on the active surface of the semiconductor chip. The outermost portions of the contact bumps may be coplanar with a major surface of the plastic housing composition. In these embodiments, the active surface of the semiconductor chip is positioned within the plastic housing composition.

Figure 2C:
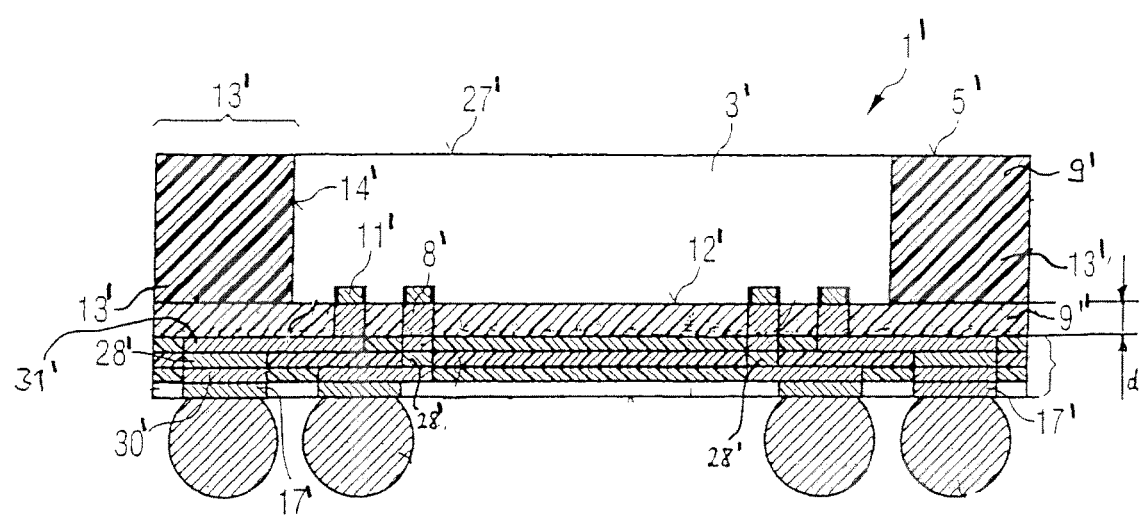
FIG. 2c illustrates a schematic cross-section view of a panel according to a second embodiment.

FIG. 2c illustrates a semiconductor package fabricated from a panel 1' according to further embodiment.

The panel 1' includes a plastic package 2' which has a plastic molding compound 9' and a layer of plastic 9'''. The plastic molding compound 9' surrounds the side edges 14' of the semiconductor chip 3' and forms side edges 13', which may be made larger to any desired extent than the side edges 14' of the semiconductor chip 3' to provide space for the external contact pads 17'. The passive surface 27' of the semiconductor chip 3' remains free from the plastic molding compound 9' and is coplanar with the second major surface 5' of the plastic molding compound 9'. The electrically insulating layer of plastic 9''' is arranged on the active upper side 12' of the semiconductor chip 3' and on the side edges 13' of plastic molding compound 9' and bridges the transitional region between the side edges 13' and the semiconductor chip 3'. The contact pads 11' of the semiconductor chip 3' are not covered by the layer of plastic 9'''.

In this embodiment, the rewiring structure is a multi-level rewiring structure. The layer of plastic 9''' carries a first wiring plane 30' and a second wiring plane 31', which are electrically connected to the contact areas 11' of the semiconductor chip 3' by means of contact vias 28' formed as contact pillars 8'. The contact pillars 8' and/or the contact vias 28' together with the wiring plane 30' may comprise galvanically or chemically deposited metal.

The layer of plastic 9''' has a thickness d which may be around 30 μm or 20 μm. Further wiring planes may be provided above the first wiring plane 30' and the second wiring plane 31'.

In order to deposit the rewiring structure onto the composite wafer including a plurality of semiconductor chips 2 embedded in an organic material, in this case a plastic composition, contamination is controlled by considering surface contamination and bulk contamination and by bringing both types of contamination down to acceptable levels within the temperature, pressure and time constraints of the system.

Surface contamination may be removed by increasing the temperature while pumping to low pressure. In addition, gas drag assisted methods may be used to accelerate the process and to make the removal relatively independent of pumping speed. The airlock degasser in a Oerlikon CLN300 or the laminar flow degasser in a CLN200 use this method to ensure high removal rates at moderate temperatures.

The removal rate of bulk contamination is determined by the diffusion rate of the volatile components through the solid films to the surface. Since solid phase diffusion tends to be a very slow process, removing these species out of the solid films can take an excessive amount of time. Within the constraints present in a production tool, it may not possible to remove the bulk contamination entirely.

The approach used in this application to deal with the contamination in the case of a composite wafer or eWLB is two fold. Firstly, the surface contamination is removed as much as possible by increasing the temperature of the substrate while purging and pumping the vacuum. This method may be used to establish a steady state of contamination background determined by the diffusion of the bulk contamination.

Then, the temperature of the substrate is rapidly lowered to lower the diffusion rate and thereby the contamination background and this low contamination level is maintained until the substrate has been capped by the first metal film by keeping the substrate at a low temperature.

Figure 3:
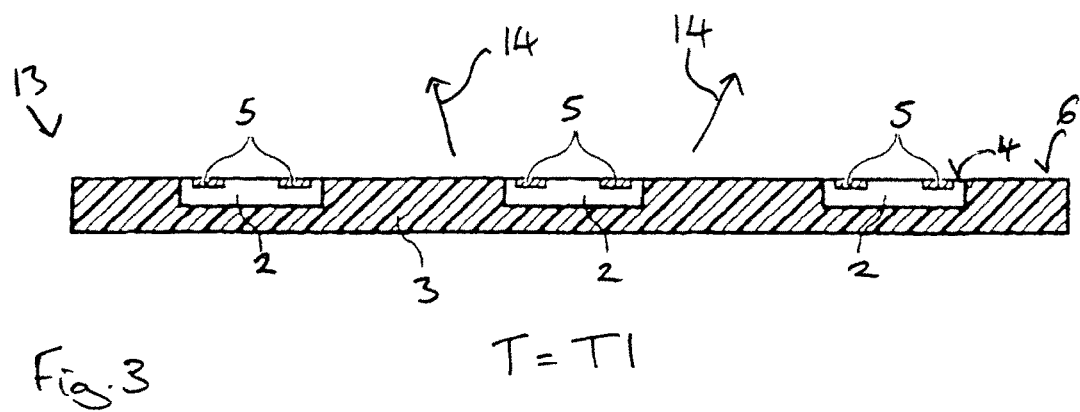
FIG. 3 illustrates an out-gassing treatment of a composite wafer.
Figure 4:
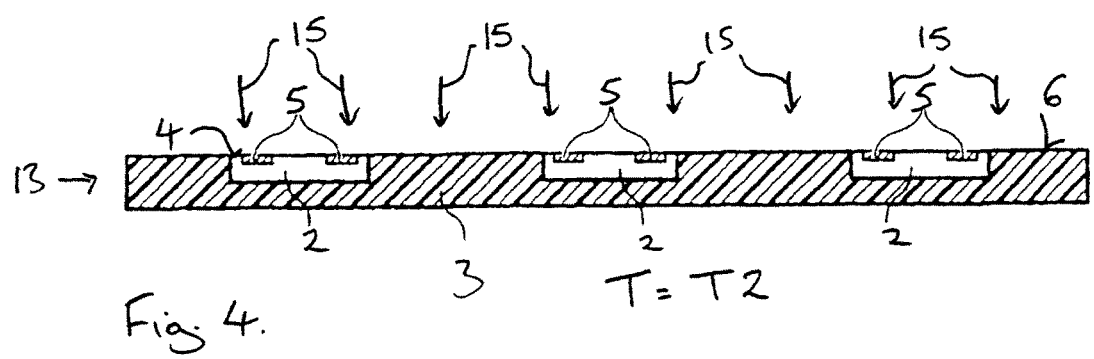
FIG. 4 illustrates an etching treatment of a composite wafer.

This method is illustrated in FIGS. 3 to 5 for the fabrication of a panel 1 from a composite wafer 13. The composite wafer 13 includes a plurality of semiconductor chips 2 embedded in a plastic housing composition 3 such that the active surface 4 of the semiconductor chips 2 is generally coplanar with a major surface 6 of the plastic housing composition 3 and so that the active surface 4 is exposed from a plastic housing composition 3.

As is illustrated in FIG. 3, the composite wafer 13 is heated to a temperature T1 to remove gaseous contaminants from the composite wafer 13 as is illustrated schematically by the arrows 14. This heat treatment is carried out under vacuum and, optionally, with gas purging to remove the gaseous matter. The temperature T1 may be around range 150° C., for example. The heat treatment may be carried out until the out-gassing rate is determined by the diffusion of the composite wafer's contamination and an essentially steady state has been established.

Afterwards, the temperature of the composite wafer 13 is lowered to temperature T2 at which the diffusion rate of the composite wafer's contamination is lower than the diffusion rate of the composite wafer's contamination at T1. Temperature T2 is less than the temperature T1. T2 may be 100K less than T1, for example 20° C. to 30° C., if T1 is 150° C.

The composite wafer is further processed at the temperature T2 until at least one major surface of the substrate has been covered with a film comprising a metal.

A second out-gassing in treatment may also be performed to remove further gaseous matter from the composite wafer. In the second out gassing treatment, the composite wafer may be heated to a temperature that is greater than the temperature T1 which was reached during the first out-gassing treatment in order to achieve the desired steady state condition.

In a subsequent process step illustrated in FIG. 4, the chip contact pads 4 are cleaned by an etching process as indicated in the figure by arrows 15. The etching process is carried out at a temperature T2.

Figure 5A:
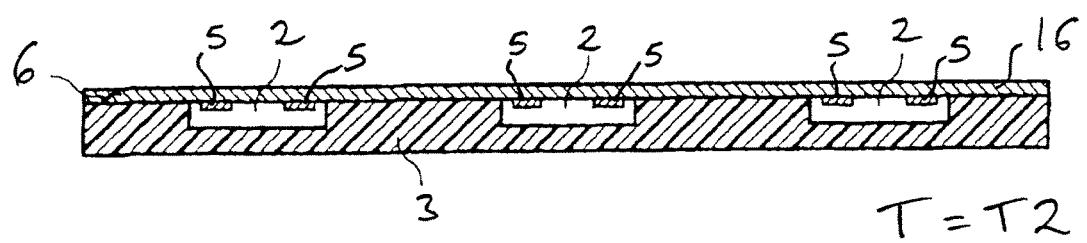
FIG. 5a illustrates the deposition of a first metal layer onto the composite wafer.
Figure 5B:
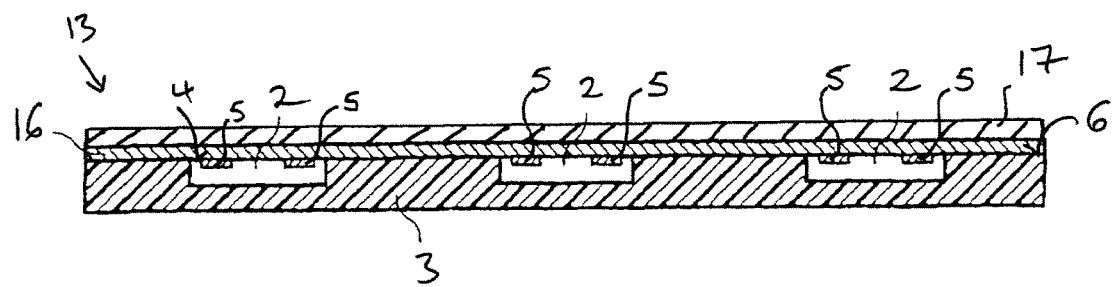
FIG. 5b illustrates the deposition of a second metal layer onto the composite wafer.

Afterwards, as is illustrated in FIG. 5a, a first metal layer 16 is deposited on to the first major surface 6 of the plastic housing composition 3, the active surface 4 of semiconductor chips 2 and onto the chip contact pads 4 to form a closed metal layer 16 on the surface of the composite wafer. This deposition process is also carried out at a temperature T2. The first metal layer 16 may be deposited using a physical vapour deposition method such as a sputtering technique.

The rewiring structure 7 may comprise a multilayer structure. In this embodiment, illustrated in FIG. 5b, a second metal layer 17 and, optionally, further metal layers is deposited on the first metal layer 16. The first metal layer 15 and the second and further metal layers, if present, may be deposited as a closed layer that is subsequently structured to produce a plurality of conductor tracks 8.

Figure 6:
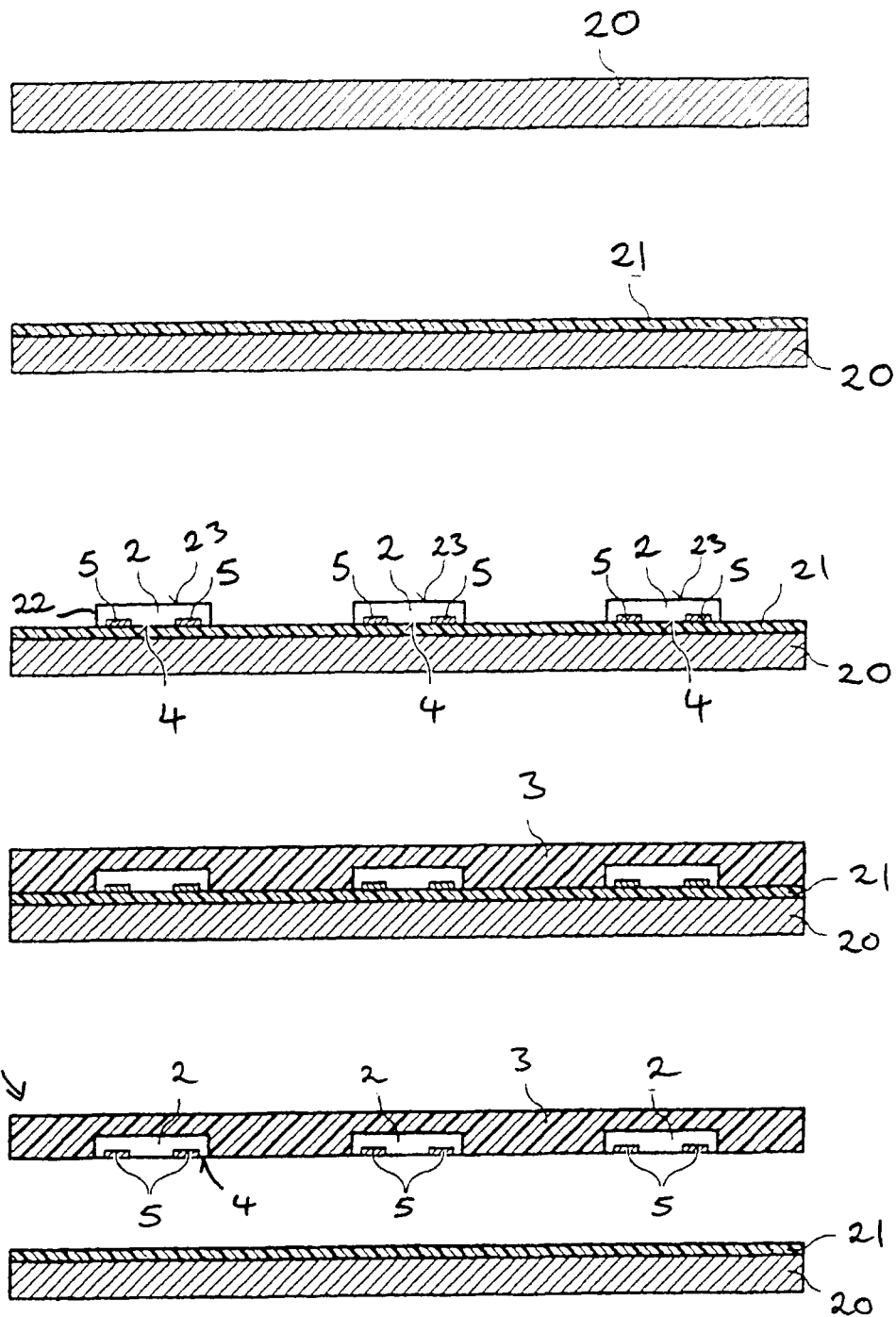
FIG. 6 illustrates the fabrication of a composite wafer.

The fabrication of the composite wafer 13 is illustrated in FIG. 6. Firstly, a support substrate 20 is provided and an adhesive layer 21 is deposited on one side of this support substrate 20. A plurality of semiconductor chips 2 are then arranged in rows and columns on the adhesive layer 21 so that the active surface 4 of the semiconductor chips 2 and, therefore, the chip contact pads 5 come into contact with the adhesive layer 21. Afterwards, the side faces 22 and rear face 23 of the semiconductor chips 2 are embedded in a common plastic housing composition 3. Subsequently, the support substrate 20 and adhesive layer 21 are removed to form a composite wafer 13.

The method according to one of the above-described embodiments may be carried out using apparatus as described below.

Substrates in the form of a composite wafer or eWLB present several challenges for processing in automated high vacuum tools.

Figure 7:
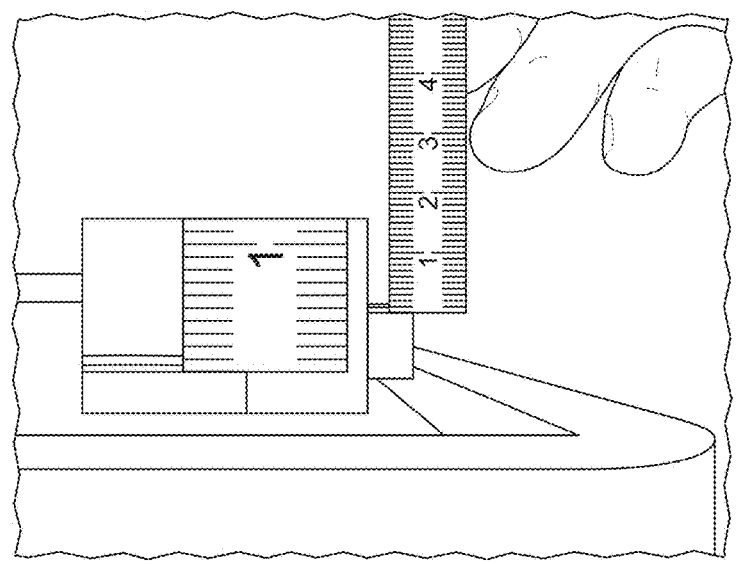
FIG. 7 illustrates substrate bow of a composite wafer.

The substrates tend to show excessive bow, for example more than 1 mm for 200 mm substrate diameter, when placed on a flat surface as illustrated in FIG. 7. This bow is naturally worse when the substrates are 300 mm Ø and are placed in a standard FOUP. The substrates show similar mechanical properties as thin wafers. However, where thin wafers show cylindrical bow, eWLB substrates show spherical bow. This has implications for both wafer handling and for substrate fixation during processing.

Figure 8:
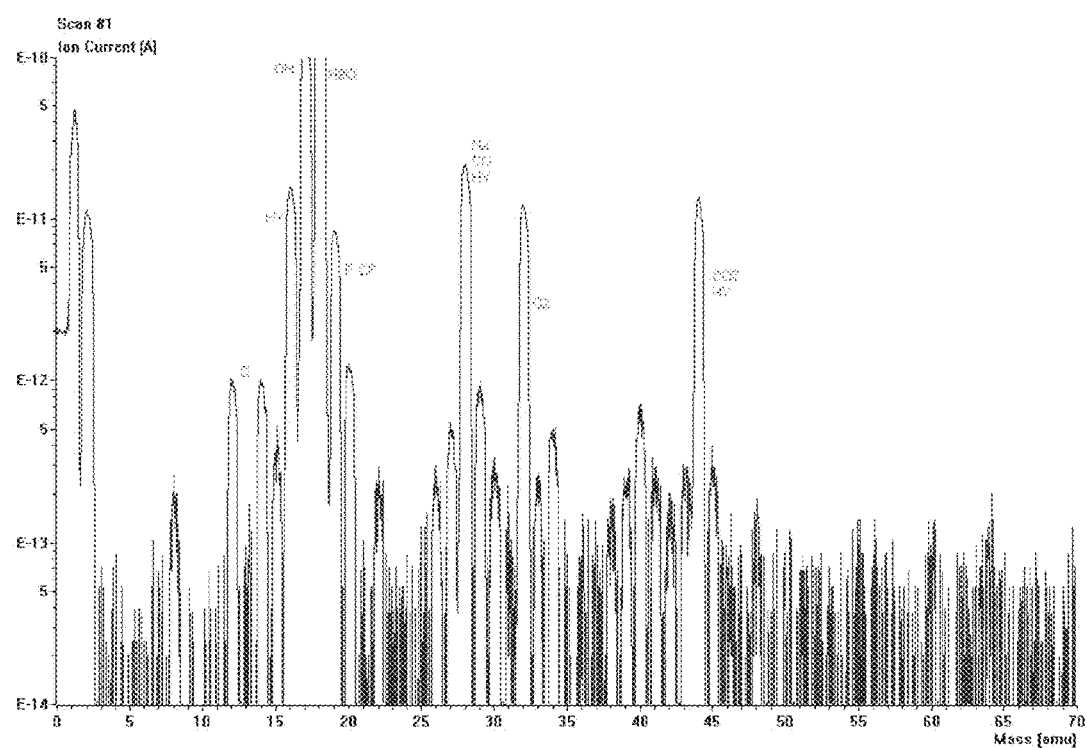
FIG. 8 illustrates a diagram of a typical RGA (residual gas analyzer) Spectrum of eWLB substrate after degassing.
Figure 9:
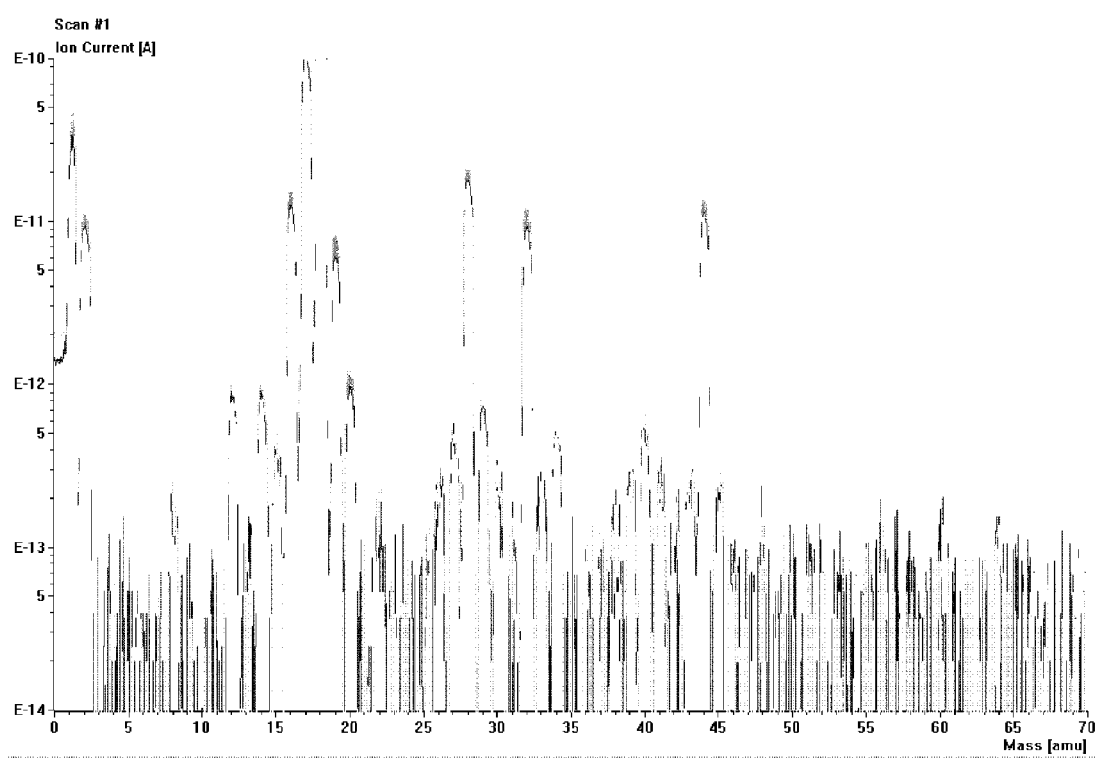
FIG. 9 illustrates a diagram of a typical RGA (residual gas analyzer) Spectrum of eWLB substrate after degassing.

The substrates show excessive out-gassing especially when heated. FIGS. 8 and 9 illustrate a residual gas analyzer spectrum of a low mass scan of a heated wafer and a peak trace of a cold and heated substrate. The out-gassing spectrum of a heated and already pumped wafer still shows pronounced evaporation of water and hydrocarbon fragments.

Comparing measurements of embedded die wafers with and without polyimid coating show somewhat higher peaks (The tips in FIG. 8) for the organic materials, indicating that the spectrum is mainly due to out-gassing of the substrate with only a small contribution from the coating. This also indicates the following.

The out-gassing rate of eWLB substrates is significantly higher then for standard Poly-Imid coated wafers. For eWLB substrates, both front and backside of the substrate contribute to the out-gassing and need to be considered for contamination control. This different from the standard processing of silicon wafers.

Figure 10:
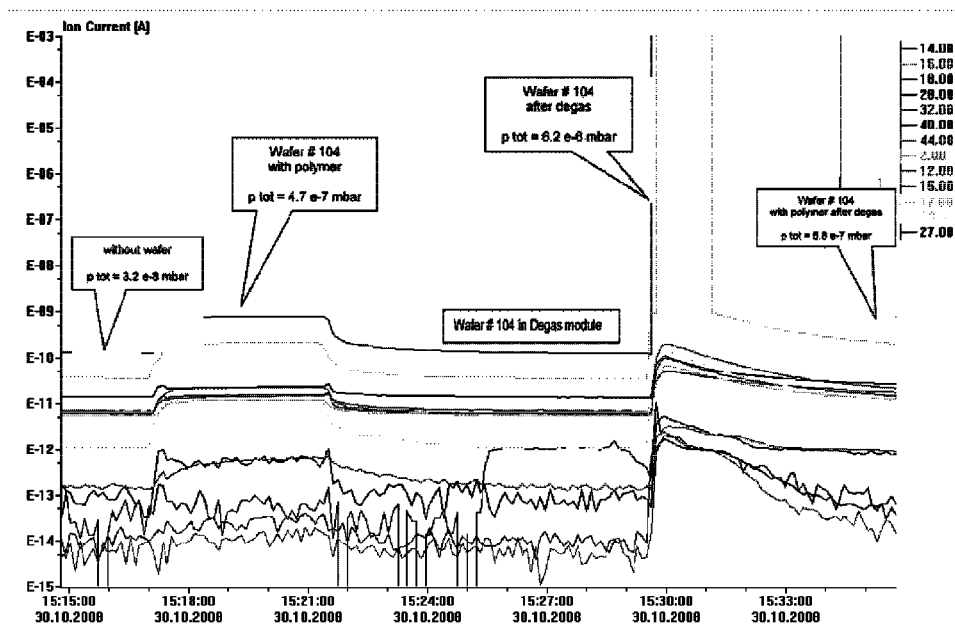
FIG. 10 illustrates before and after degas.

The eWLB or composite wafers also comprise water which vaporates when the substrate is placed into a vacuum. This water can cause contamination of the chamber and of components of the composite wafer, such as the chip contact pads. FIG. 10 shows the difference in behavior of room temperature and heated (150° C.) substrates in the same chamber.

The room temperature out-gassing is already significantly present, showing a 10-fold increase in water background. Compared to standard silicon wafers, which show no effect on the peak traces at room temperature, this is significant.

In addition, once the composite wafers are heated to about 120 to 150° C., an increase of more then $10^8$-fold in water background may be observed. This is much more then a standard etch process can handle with acceptable quality and speed.

The indicated total pressures show that the water partial pressure reaches about $6 \times 10^{-6}$ mbar. This is about one percent of typical process pressures for the contact clean. This may have adverse effects on the quality of the contact clean.

In addition, substrates showing this amount of water contamination of the process gas during sputtering of corrosive materials like Titanium are likely to show very high levels of oxides due to the reaction with water. This may also seriously affect the quality of the contact. For silicon substrates, this out-gassing effect will subside once a certain material thickness has been deposited. For eWLB composite wafer substrates this can not be assumed since the out-gassing of the substrates then comes from the backside of the substrate.

Similar effects as for the water contamination can be postulated for organic contaminants. As for water, hydrocarbons will play a role in the chemistry of the etch cleaning and of the deposited films which may lead to poorly controlled contact quality.

Organic contaminants show one pronounced additional negative behavior. Due to the nature of the contaminants, these volatile species react in the plasma environment to form larger polymeric molecules with extremely high vapor pressures. These newly formed materials tend to accumulate in the reactor. Of reactors in use, heavy deposits can be observed on cold areas, especially when located downstream of the plasma towards the pump.

The effect of these deposits on the process is not yet known. However, the effect on the vacuum quality is in some cases extreme. Base pressure levels 15 to 30 times higher then normal have been observed. Naturally, this leads to extremely long pump-down periods after maintenance and in many cases, the specified base pressures of clean equipment can never be achieved and continues to deteriorate.

A second effect is that these deposits generally severely affect the adhesion of etched films on the reactor vessel and components. This may lead to accelerated formation of particles, which may in turn force the frequent change of cleaning parts and extensive cleaning procedures for the equipment.

Therefore, organic contaminants, albeit not directly adverse to the process, may severely decrease the equipment availability and performance.

The effects described here are experiences with equipment running polyimide coated wafers. As shown by out-gassing analysis, this type of substrates show moderate organic out-gassing in comparison to eWLB substrates. It can therefore be expected that the equipment degradation is greatly accelerated when running eWLB in production.

In summary, the following implications of running eWLB substrates may be mitigated by modifying standard processing methods in one or more of the following ways.

The undefined flatness of the substrate can be compensated by adaptations to the handling system. Similar measures to those used for thin wafer handling methods may be used.

The contamination generated by the substrate is be well controlled throughout the process, for example by thermal management and pumping arrangements.

Since contamination can only be minimized and not completely avoided, measures may be implemented to deal with the accumulation of residuals in the equipment so as to reduce maintenance time and increase production levels.

Figure 11:
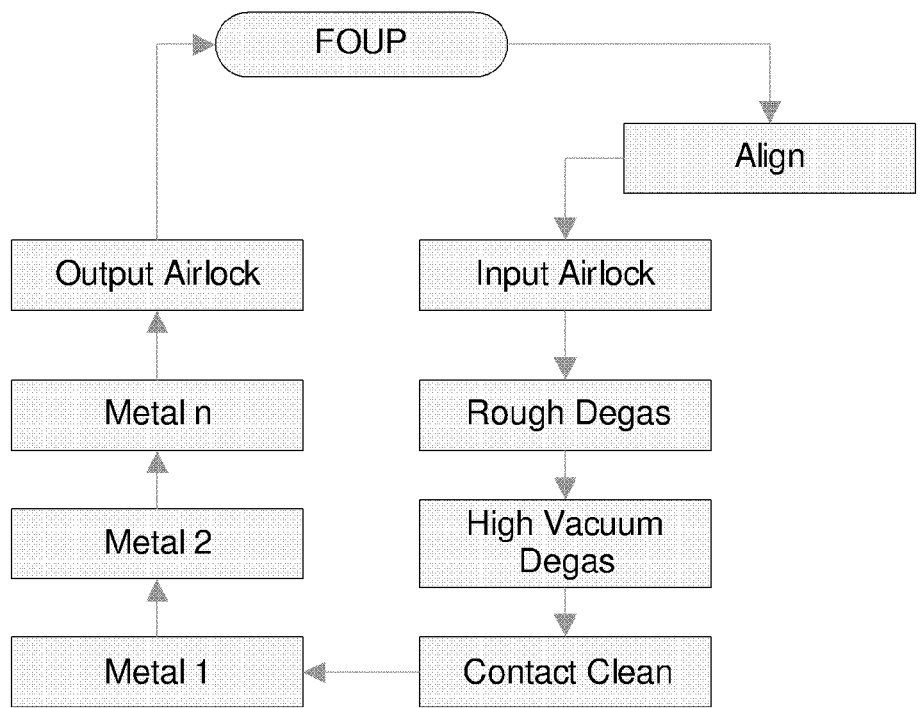
FIG. 11 illustrates a comparison UBM Flow.

These considerations are all based on a "standard" packaging material and process flow as depicted in FIG. 11 for UBM=under bump metallization. This process flow can be considered as a comparison process flow.

In this flow, the material is taken from a SEMI standard FOUP (SEMI E1.9-1106 and SEMI E47.1-1106) by an atmospheric handling system and is placed on an aligner to position the notch and to compensate for displacement. Then the substrate is moved into an airlock in which it is evacuated. During this phase, the temperature of the substrate may already be increased. In the next step, the substrate is heated under high vacuum and subsequently moved to an ICP etch contact cleaner and several PVD sputter chambers for the metal stack. Finally, the substrate is moved out of vacuum through an airlock and positioned back into the FOUP. In case the substrate needs cooling, this is done in the output airlock.

Figure 12:
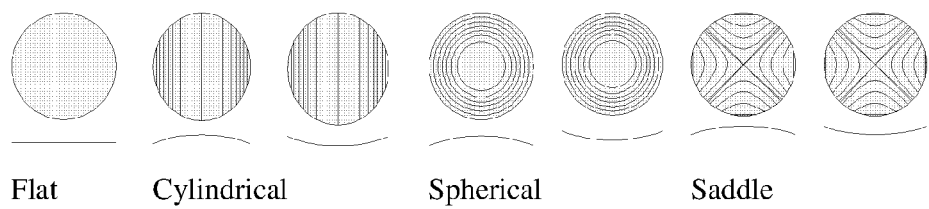
FIG. 12 illustrates various deformation types of substrates.

FIG. 12 illustrates various types of substrate deformation. According to SEMI-M001-0309, the wafer warp or thickness deformation should be less the 100 μm. Standard handling equipment for atmospheric and vacuum wafer transfer and process station hardware is normally designed to handle SEMI-specified flatness of substrates. The determined bow/warp of 200 mm eWLB substrates and the expected bow/warp of 300 mm eWLB wafers require equipment adaptations to deal with such large tolerances on wafer substrate flatness.

One other application where large tolerances on the wafer flatness occur is in thin wafer processing. This technology is well know and is in production in many Clusterline tools. However, the methods applied to successfully handle thin wafers are for a large part based on the fact the crystalline substrates tend to show cylindrical bow. That means, the substrates show a large deformation along one axis parallel to the substrate surface, but are extremely rigid and flat along any other axis. This is due to the incompressibility of the crystalline material.

eWLB substrates are made out of materials with very different properties. Therefore, this substrate deformation does not depend on the axis and deformation along one axis does not influence deformation along other axis. So, these substrates can show many different shapes. Any processing equipment should be able to deal with these different shapes.

Finally, during its trajectory through the equipment, the substrate will present itself to the equipment at many different temperatures and film stress levels. It can therefore be assumed that the deformation of the substrate can change during the processing cycle. This again puts the requirement on the system to be relatively insensitive to the actual shape of the substrate.

The shape tolerance on these substrates influences the design of the following subsystems in a Clusterline processing tool.

Front-end Robot: This is probably the most critical component since it has to transfer the deformed and randomly orientated substrates in and out of the confined space between two other deformed substrates in a FOUP cassette. The substrate shape and motion confinement impacts the design and the end effector which should safely hold the substrate regardless of its shape. The design of the end effector defines the motion trajectory of the robot. Finally, since the substrate deformation imposes large tolerances on the actual vertical position of the substrate in the FOUP, the mapping system should accommodate these tolerances while still being able to clearly assign a substrate to a slot position in the FOUP.

The Substrate aligner: The substrate aligner should be capable to safely hold the substrate in position. The aligner optical system should cope with a substrate edge that may run in and out of focus during a scan turn.

Input and output Airlocks: Both airlocks need to be capable of handling deformed substrates.

Vacuum Robot: Aside from the initial deformation of the substrate, the vacuum robot will have to cope with a changing shape of the substrate as well. This means that the robot end effector should be very insensitive with respect to wafer shape. The design of the end effector should also take into account that some of the processes in the system may be very sensitive to temperature and temperature fluctuations. Therefore, the thermal contact of the end effector to the wafer should be minimized.

Process station hardware: the substrate receiving pins, which take over the substrate from the end effector, should allow for sufficient tolerance on vertical placement and should provide sufficient room for the end effector to move underneath a placed wafer.

Wafer Sensing Systems: Wafers sensing systems which use the vertical project of the wafer will be able to handle deformed substrates as long as the project shape is with the tolerances of the sensing system. Using features like displacement sensing based on edge detection may show to be difficult since the system can no longer assume that the substrate projection is a circle. Wafer sensing done on vertical edge detection may show impossible to use since the vertical position of the wafer edge is not very well defined.

The general approach for the handling system for composite wafers is similar to that used for thin wafer processing for many years. Instead of trying to force a shape on the substrate, the handling system should be designed to be very tolerant to the vertical deformation of the substrate. Additionally, in comparison to thin wafers, the ways the substrate can be deformed is much larger and it is unlikely that a handling system can be designed to handle all possible deformations. If this is the case, the limitations of the handling system should be defined so that proper specifications can be made for the shape tolerances of the substrate.

There are several aspects to the processing of eWLB substrates which should be considered during the definition of the processing hardware. The aspects that impose limits or challenges are out-gassing, thermal budget and shape tolerance. Each aspect requires specific considerations for each station along the process flow through the tool. Some general considerations for certain equipment functions are follows.

Temperature: Substrates with high organic content and especially molded substrates have limited thermal capabilities. As a rule, the temperature of these types of substrate is not allowed to rise above around 150° C. Surpassing this temperature may damage the substrate and should be avoided. For this reason only systems should be used which provide adequate temperature control. For example, lamp heating may be used, but the actual temperature depends very much on the substrate and the environment, so temperature control may prove difficult. Also, during plasma processing, large amounts of heat are injected into the substrate. It may be necessary to cool the substrate during such steps.

Plasma Power: Following the limits on thermal budget, the power deployed during plasma processing should be set to a level which allows the cooling element to keep the temperature below the maximum acceptable temperature of the substrates.

Wafer Chucks: The requirements for the chucks depend very much on the process requirements. In case a proper and uniform contact to the chuck surface is required, e.g. when using RF or thermal coupling, the wafer shape should be adapted to the chuck. The only way to do this is by mechanically forcing the wafer on the chuck. However, in case of upward bow of the substrate, edge clamping will still not guarantee proper alignment of substrate and chuck. When the contact of the wafer to the chuck is not required out of process reasons, it is better to avoid the contact altogether.

Substrate clamping: For standard silicon wafers, electrostatic clamping may be used. However, since the molded substrates are electrically insulating these clamps can not be used unless a conductive film is deposited on the backside of the substrate. This usually limits the selection to mechanical clamping in which case the front side of the substrates is touched and there is a significant risk of sticking to the clamp when "soft" polyimide is used as a top coating. Therefore, clamps should be able to handle wafer sticking.

Vacuum pumping: Some modules will see very high amounts of volatile organics and water. This means that the pumping geometry and pump types should be able to handle these gases. The species involved, water and organic material, impose conflicting requirements on the pump types. Where cryogenic pumps are most suitable for water, the organic components may degrade these pumps rapidly. Turbo pumps may be used when the pumps are heated to accelerate the pump speed for water and to minimize organic depositions. Another option is to apply very high local pumping speeds to the substrate in the form a cooled baffles or traps. These traps then need to be regenerated.

Aside from these general aspects, each specific station should be configured for its purpose in combination with these substrates. Following a standard process flow through the equipment (FIG. 7), guidelines that apply; FOUP, Handling and aligner are considered to be not process relevant.

Input Airlock: The input airlock can be used as initial check on the out-gassing of the substrates when installing an RGA to monitor the residual pressures. This allows the verification of the background pressure before the input airlock is allowed to open to the vacuum backend of the tool. If this is combined with a substrate heating capability in the airlock, the unit becomes an integral part of the process flow where the first degassing step of the substrate is performed. This may however increase the level of out-gassing of the substrate when traversing from airlock to first process chamber. Therefore, careful selection and control of the substrates temperature in the airlock is mandatory.

High Vacuum Degasser: In this station, the temperature of the substrate is increased under very low pressure to remove evaporating components from the substrate which may harm the subsequent processes. While the process takes place under very low pressure, a heated substrate holder with gas assisted thermal coupling should be used. To guarantee that each substrate is properly out-gassed and is allowed to move to the next process step with repeatable contaminating properties, the use of the process monitor as endpoint detector for the process is favorable. Since the degassing station will mainly see high water and organic pressures, proper pumping systems for these species should be installed. The added support of gas-drag schemes, e.g. Nitrogen flushing, can be considered as well.

ICP Contact clean module: where in the previous process stations the temperature of the substrate is driven as high as possible to enhance out-gassing, in the etch station this out-gassing should be minimized. The main reason is to lower the partial pressure of reacting species which may contaminate the contact cleaning process. A secondary reason is to minimize the formation of organic deposits in the chamber which decreases the tool availability. The substrate temperature should be brought to a level so that acceptably low vapor pressures are obtained. This could mean that the substrates should be chilled. This low temperature should also be maintained during plasma processing. This means that sufficient thermal conductance should be present from the substrate to the chuck. So, wafer clamping and backside gas should be deployed.

Metal 1 Module: Similar arguments as in the etcher apply to the first metal layer to be deposited. Out-gassing from the substrate should be minimized to ensure proper contact properties by avoiding contamination of the metal film interface. Therefore, at least during the initial depositions, the temperature of the substrates should be kept at its minimum. A secondary effect of low out-gassing of the substrates is that the lifetime of the shields can expected to be longer. So, a cooled chuck, if possible with backside cooling, should be deployed in this station. Lowering the deposition temperature will affect the film stress. This may implicate that stress controlling process measures like RF bias or pulsed DC are required.

Other Metal: during subsequent metallization of the substrates, the temperature is no longer critical. Since the front side of the substrate is now coated with metal, the out-gassing of this surface area will be minimal. The out-gassing of the backside could still be significant. Measures should be implemented to keep these residual gases separated from the plasma processing to allow proper metallization. It could still be required to deal with these gaseous components to avoid or minimize chamber contamination. A standard clamped backside gas chuck already keeps the wafer backside separated from the plasma process. The backside gas will continuously purge the wafer backside. Some modifications may be required to guide the contaminated gas into the pump.

Regardless of the minimizing measures, some solid contamination will remain present in the system after each substrate. This will lead to accumulation over time. So, in order to keep the equipment operational, measures should be implemented to remove these residues from the system.

In a crude form, removal of solid residues is done by opening the process chambers and cleaning or replacing components. This is a common practice and is acceptable as long the interval after which this periodic maintenance needs to be performed is similar to maintenance tasks on the rest of the equipment.

Furthermore, these maintenance tasks should assure that a stable and acceptable condition for the process equipment is maintained. Especially with solid residues depositing anywhere in the vacuum chamber, this may prove very difficult to achieve.

Most of the solid residues in the system are formed by polymerization of material evaporated during processing. This opens the possibility to develop and implement effective in situ cleaning methods to maintain system conditioning by oxidizing the organic material in a direct or indirect Oxygen containing plasma.

In order to keep the system at specified condition, it is preferred to execute these cleaning and conditioning steps at the shortest possible intervals. While this would lead to excessive manual interventions, the Clusterline software offers the AMS (=Automated Maintenance Services) feature. With this feature, in situ cleaning, conditioning and preparation steps can be programmed to be executed based on equipment history or pending task.

Figure 13:
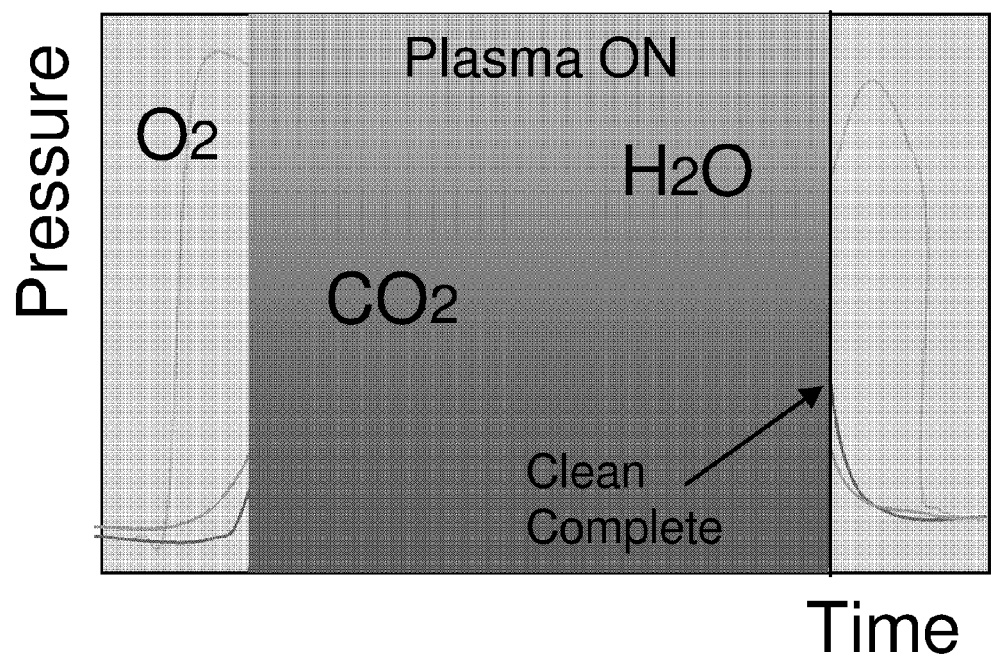
FIG. 13 illustrates a qualitative cleaning cycle with endpoint detection.

A process monitor which detects the reaction products may be used to assure that the cleaning sequences have been completed. With such a monitor, the length of the cleaning process depends on the actual contamination state of the process chamber so that a reproducible state is achieved after each cleaning. FIG. 13 illustrates a qualitative cleaning cycle with end point detection.

In situ cleaning can be deployed in any chamber which has the capability to maintain plasma and in which oxygen plasma does not damage the system. These conditions are given in the ICP etcher and can be achieved in the degasser by installing an RF generator on the chuck.

In order to achieve proper in situ cleaning, it is important that deposits are contained to areas which can be cleaned with the plasma and/or to areas which can be readily cleaned during periodic maintenance. This may require additional shielding. The considerations outlined may be translated in an overall equipment concept. First, the limitations and existing status are described after which the required modifications are defined. Finally, the new tool configuration and qualitative performance is defined.

In order to make the transition from standard packaging UBM equipment to eWLB equipment possible and with the lowest possible risk, existing capabilities may be used in the eWLB configuration as much as possible. It may also be advantageous to retrofit field deployed equipment to handle these substrates.

Figure 14:
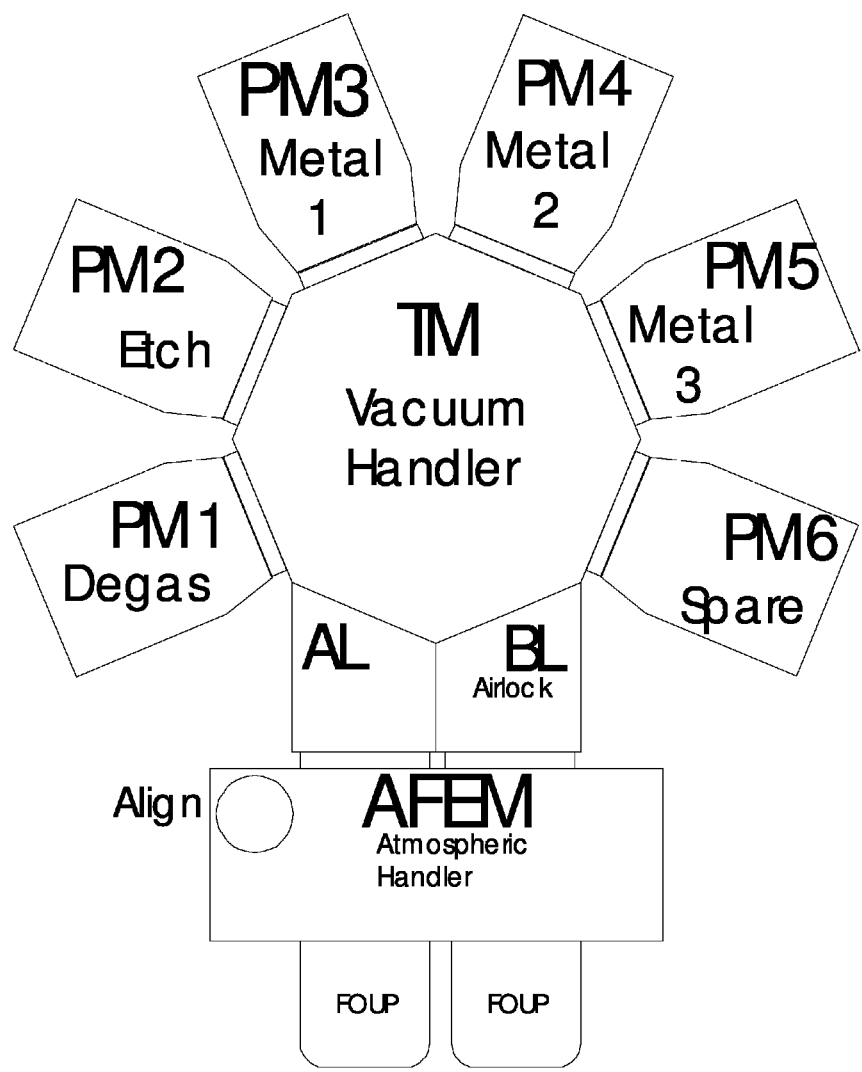
FIG. 14 illustrates a standard packaging apparatus cluster layout.

Tests have shown that standard Oerlikon packaging equipment can be used to achieve acceptable process results with eWLB substrates. These tests were done on equipment as outlined in FIG. 14 with 200 mm substrates. Wafer handling did not prove to be an issue for 200 mm.

The equipment uses a module degasser with heated chuck and an ICP chamber without temperature control on the substrate. All metal films are deposited "clampless", which also means that no temperature control is present.

The process sequence in this equipment is the standard degas—etch—metallization—cooling used for many years for packaging applications.

Figure 15:
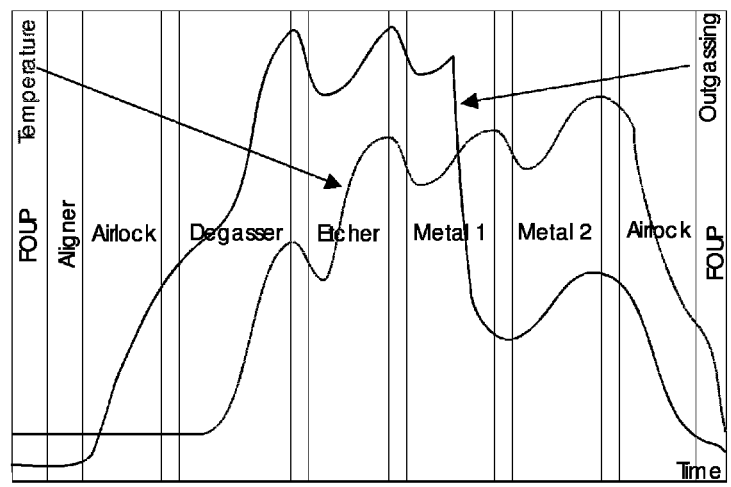
FIG. 15 illustrates a qualitative overview of temperature and out-gassing for a standard comparison process.

Initially, the substrates were processed with the standard UBM (under bump metallization) process flows and recipes. This did not lead to satisfactory results. The out-gassing of the substrates led to very high pressure bursts in the transfer chamber and the etch process was unstable or would extinguish due to excessive pressure increase during plasma. The film quality was not acceptable. A qualitative temperature and pressure curve of this process flow is given in FIG. 15.

Figure 16:
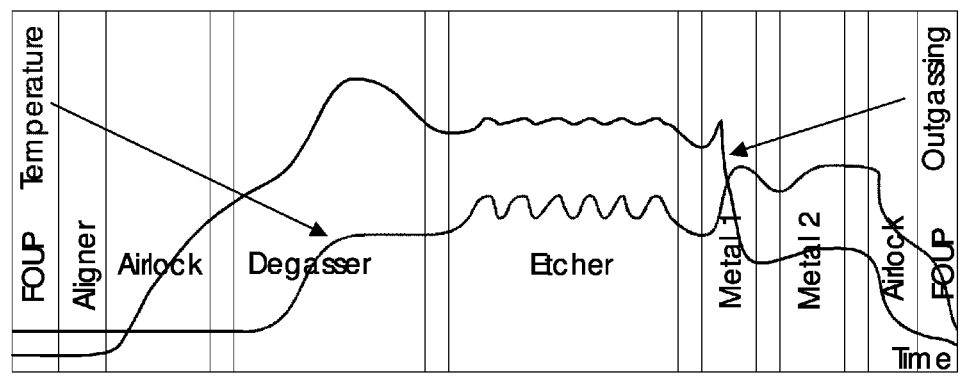
FIG. 16 illustrates a qualitative overview of temperature and out-gassing according to an embodiment.

Both the degas and etch process of the comparison UBM process are modified to provide a suitable result for composite wafers. The degassing processes was extended in time and the etch process was interrupted several times to allow the substrate to cool between subsequent etching steps. A qualitative temperature and pressure curve of this process flow is given in FIG. 16.

This process did yield the desired contact and film properties but the time extension resulted in a throughput roughly 30% of the throughput of the standard process.

Production experiences with this slow process shows that the accumulation of contamination is similar or worse than the standard UBM processing of wafers with polyimide coatings. Since the time between maintenance is already very short for these processes, it is similar or worse for eWLB substrates. It can be expected that these items will deteriorate even further when using 300 mm substrates.

In conclusion, even though the process results for the original equipment are acceptable, throughput and maintenance should be improved for an economically viable production solution.

Figure 17:
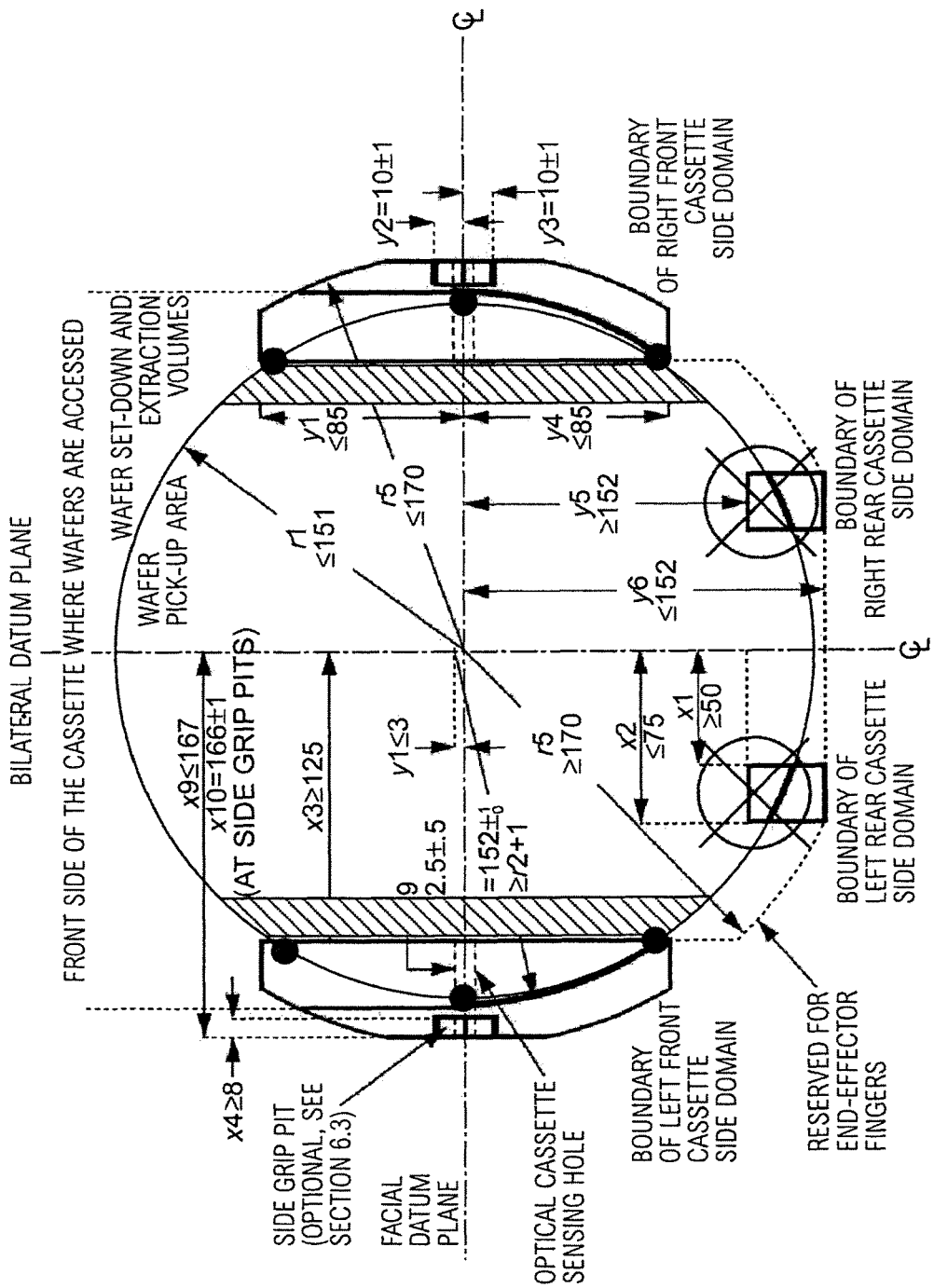
FIG. 17 illustrates a FOUP specification drawing overlaid with TWP features.

FIG. 17 shows a cassette plane overview taken from SEMI E1.9-0611. Based on thin wafer methodologies, some annotations have been put in this drawing.

The annotations in this figure depict the critical items for handling of deformed substrates. The difficulty arises since, aside from the support point in the cassette, it is fairly unknown where the wafer is located. Any wafer handling is limited to those areas of the wafer which are close enough to these supporting features to stay within the handling tolerances of the system.

Indicated in the figure are six dark dots, depending on the deformation of the substrate, the substrate will be support by any three of these dots. Since the height of these dots is exactly defined and the substrate deformation stays within certain limits, the substrate position is fairly well know in the hatched areas of the substrate. This is where all the substrate manipulation has to take place.

The rear support features in a standard FOUP cassette are clearly outside of the hatched areas. This means that the actual position of the substrate can not be assumed to be at the right level to be supported by such features. In case a substrate shows cylindrical downwards bow, the placement of the substrate will lead to a collision with these feature. These have to be removed from the cassette.

All remaining handling features in the equipment should be located in the hatched areas to ensure safe substrate manipulation regardless of the shape of the substrate. That means that end effectors can have only two legs and that process modules should have four receiving pins.

Contamination control should deal with surface and bulk contamination. Both types of contamination should be brought to acceptable levels within the temperature, pressure and time constraints of the system.

Figure 18:
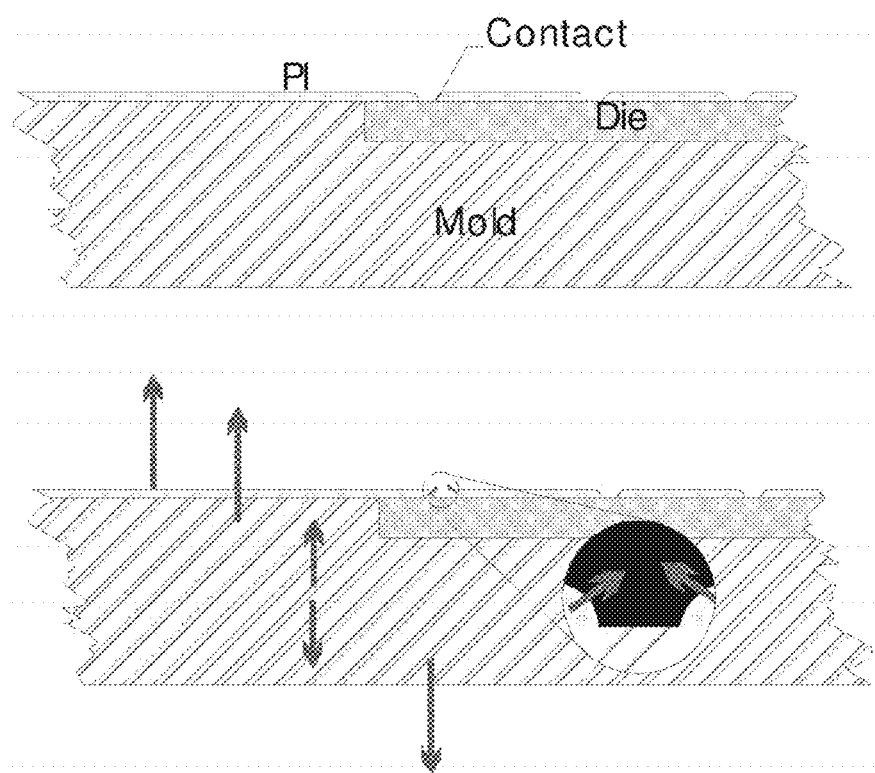
FIG. 18 illustrates possible surface and bulk contamination flows.

Surface contamination may be removed by classical methods such as increasing the temperature while pumping to low pressure This is illustrated schematically in FIG. 18a. Gas drag assisted methods may be used in addition to accelerate the process and to make it relatively independent of pumping speed. The airlock degasser in a Oerlikon CLN300 or the laminar flow degasser in a CLN200 may be used in this method to ensure high removal rates at moderate temperatures.

Bulk contamination is illustrated in FIG. 18b may be more difficult to deal with because the removal rate is limited by the diffusion rate of the volatile components through the solid films to the surface. Since solid phase diffusion tends to be a very slow process, removing these species out of the solid films can take excessive amount of time. Within the constraints present in a production tool, it may not be possible to remove the bulk contamination entirely.

The approach used here to deal with the contamination in the case of eWLB is two fold:

The surface contamination is removed as completely as possible by increasing the temperature of the substrate while purging and pumping the vacuum. This method may establish a steady state of contamination background determined by the diffusion of the bulk contamination.

The temperature of the substrate is then rapidly lowered to lower the diffusion rate and thereby the contamination background and keep this low contamination level until the substrate has been capped by the first metal film.

Figure 19:
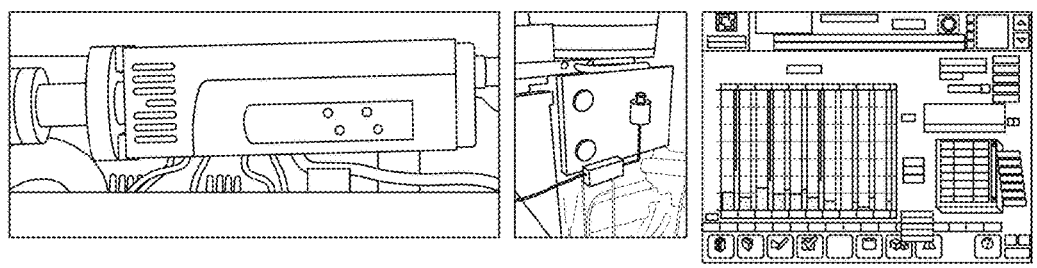
FIG. 19 illustrates Integrated Process monitor implementation.

In order to determine the steady state of evaporation, the use of vacuum partial pressure monitors may be beneficial and can remove dependencies of substrate quality. FIG. 19 shows a sample implementation of such a process monitor.

In order to allow contamination containment and recovery, the equipment is configured with Oxygen gas where possible and the appropriate software to enable the automated maintenance services.

Deploying the considerations outlined above and the implementing the concepts outline above, a process tool can be configured that allows processing of eWLB or otherwise contaminating substrates with acceptable process performance, throughput and maintenance intervals. This section describes the equipment station conceptual details.

Figure 20:
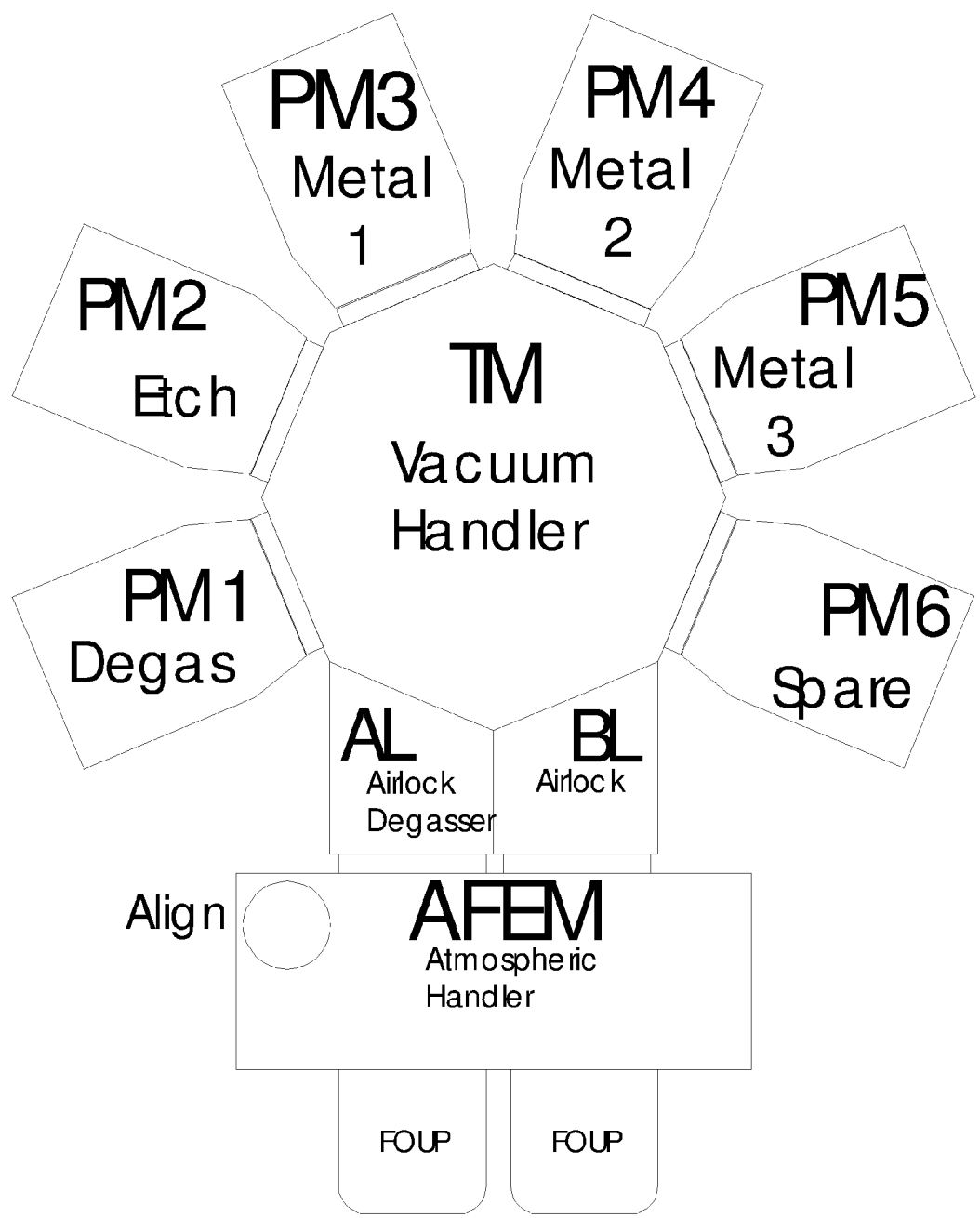
FIG. 20 illustrates a Tool Overview for composite wafer processing.

For the overall equipment configuration, the required changes are not extensive. The capability to process eWLB substrates is created by a collection of configurations and modifications on very detailed level in the individual process stations. For completion, the overall layout of the tool is presented in FIG. 20.

The overall process flow is similar to the original UBM process flow with adaptations focusing on temperature management and the required upgrades for process control.

Figure 21:
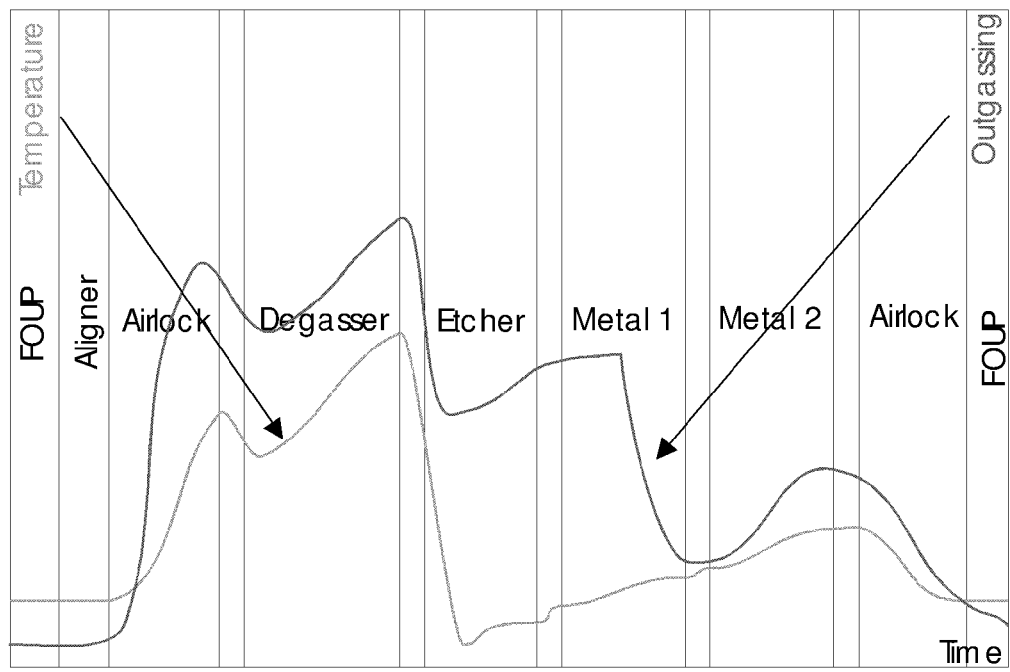
FIG. 21 illustrates a Qualitative overview of temperature and out-gassing for eWLB process according to an embodiment.

The qualitative target temperature curve is presented in FIG. 21. The main objective is to drive the temperature as high as possible in the degassing stations which are specifically configured to deal with high contamination level and to keep the temperatures in all subsequent steps as low as possible. Alternatively, the temperature is kept as low as possible until the first metal has been deposited to cap the substrate.

Figure 22:
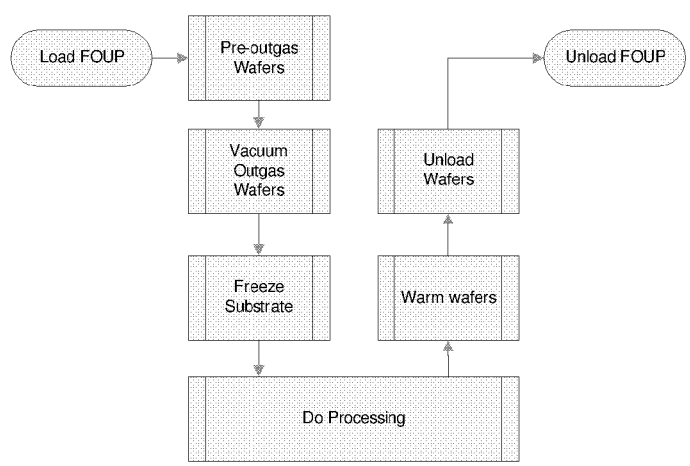
FIG. 22 illustrates a method for fabricating a panel according to one embodiment.

The figure above leads, in very rough outline, to the process flow illustrated in FIG. 22. First the FOUP is loaded with substrates which in this embodiment are composite wafers. The substrates are pre-out-gassed in the inbound airlock, vacuum out-gassed and cooled to a temperature at least 100K less than the temperature at which a steady state of out-gassing was achieved. The substrates are then further processed by maintaining the low temperature until at least a metal film is deposited onto the substrate. After the processing is completed, the substrates are warmed up and removed from the apparatus.

According to this method, it is not necessary to lower the out-gassing rate down to the minimum, but to establish a balance i.e. a steady state at a temperature T1 in which the out-gassing rate will be determined solely by the diffusion rate. The substrate's bulk continuously produces gas and it is continuously pumped. However, substrate surface contamination and chamber contamination do not contribute significantly to the out-gassing. By subsequently lowering the ambient temperature to T2, the diffusion rate is lowered. This has the effect that the pump power is sufficient to guarantee a low level overall contamination, although etching, metal deposition with additional working gases takes place. Therefore the substrate is further processed at T2 until surface is covered by a metal film so as to avoid raising the temperature which would again increase the out-gassing rate.

The following sections describe suitable configurations for each station of the apparatus.

The FOUP station itself does not require modification over one used for silicon wafers. However, the FOUP cassette is probably not compatible with deformed substrates. It may be unavoidable to remove the two rear support features.

Figure 23:
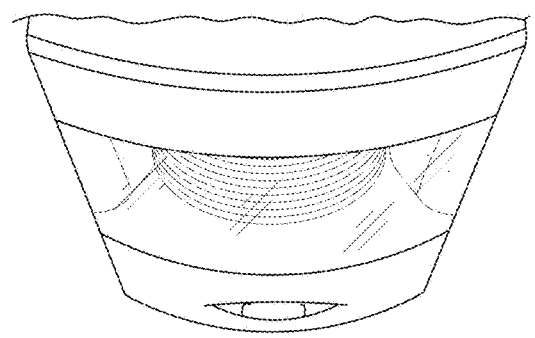
FIG. 23 illustrates a FOUP suitable for bowed substrate.

As shown in FIG. 23, appropriate FOUP cassettes are commercially available. A proper selection should be made.

Figure 24:
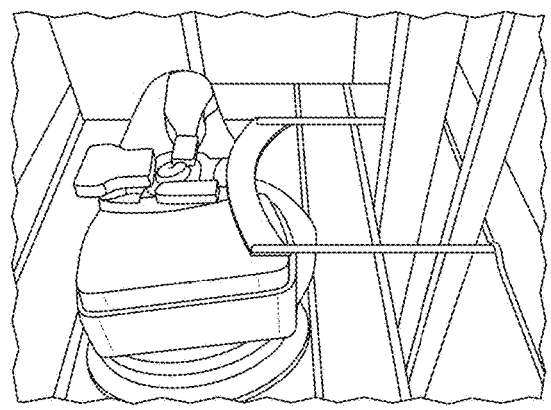
FIG. 24 illustrates a Front end 4-axis robot with TWP hardware.
Figure 25:
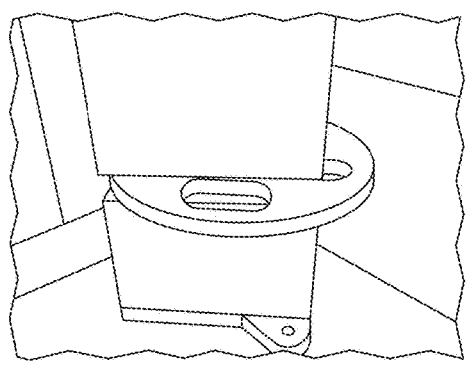
FIG. 25 illustrates an aligner with large area chuck.

FIG. 24 illustrates a front end robot modified to allow handling of deformed substrates. All of these changes have already been in production for several years. The required changes are:

End effector: The TWP end effector should be used so that the wafer manipulation is limited to the areas indicated in FIG. 17.

Wafer Present sensing: The standard vacuum wafer present sensing should be replaced with the optional optical wafer detector Wafer Mapper: The wafer mapping is similar to thin wafer mapping with the exception that the required mapping angle for this wafers can be omitted. The mapping should be adjusted to map the wafers as close as possible to the side of the cassette.

Robot type: The wide thin wafer end effector requires the motion trajectory of the robot to be perpendicular to the front face of the FOUP and other station. This requires a change to a four axis robot.

FIG. 23 illustrates an aligner with a large area chuck. The aligner is the only system where the wafers are manipulated outside to the areas indicated in FIG. 17. The aligner should be equipped with the large area thin wafer chuck.

Figure 26:
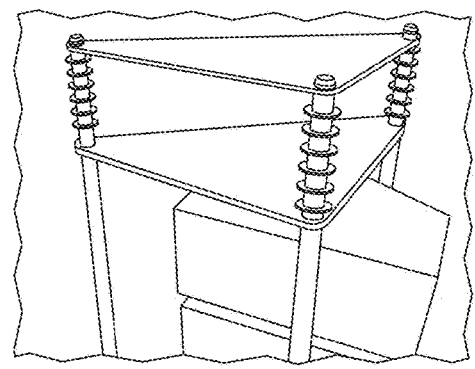
FIG. 26 illustrates a Maintenance Material Buffer.

Some maintenance cycles, like target pre-sputtering or pasting procedures require the use of maintenance materials. This material is only used by the AMS system and can remain in the tool for extended periods. FIG. 26 shows a front end implemented buffer for six maintenance substrates.

Figure 27:
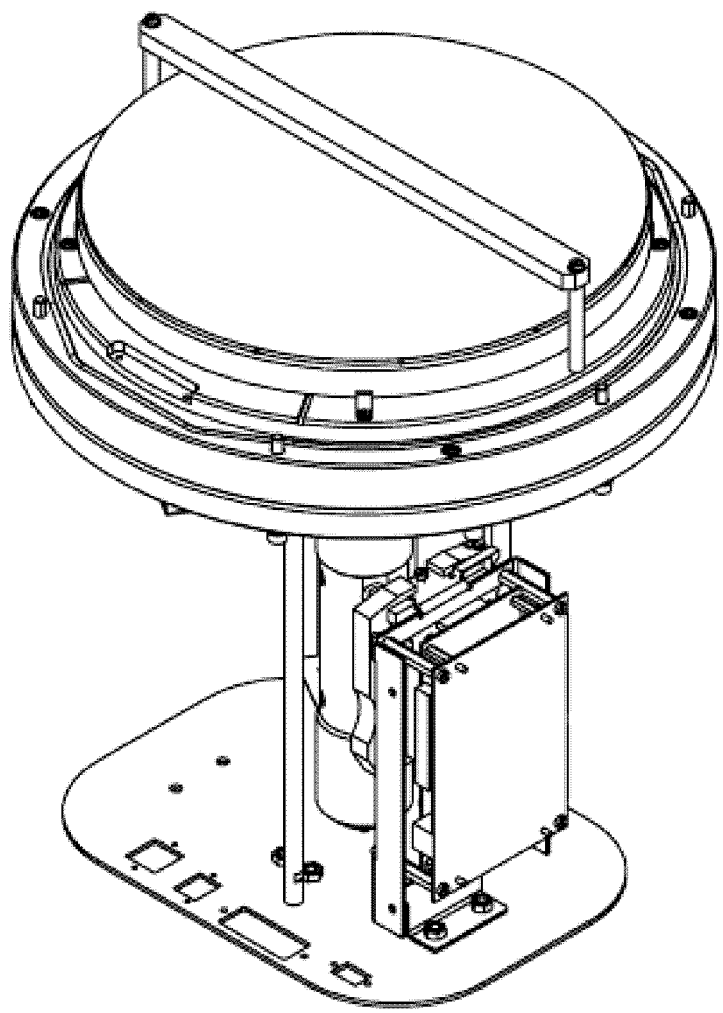
FIG. 27 illustrates a CLN300 Airlock Degassing Unit.

FIG. 27 show the degasser insertion unit for the Brooks GX8000 transfer airlock. This unit allow for temperatures up to 300° C. To enable airlock degassing, this unit should be configured.

In addition to the heater, a new modification to the pumping system is required to implement the process monitor. The process monitor should be mounted on the downstream side of the high vacuum (turbo-isolation) valve in the system to prevent the intermittent venting of the device.

The process monitor is implemented to assure that the substrates being allowed in the vacuum backend of the tool are all properly out-gassed. In case this can not be achieved with the allotted time, the substrates can be moved back to the cassette without any processing for failure analysis.

For wafer handling, the receiving pins in the airlock need to be configured for this wafer handling.

This airlock only requires the modifications to enable thin wafer handling

Figure 28:
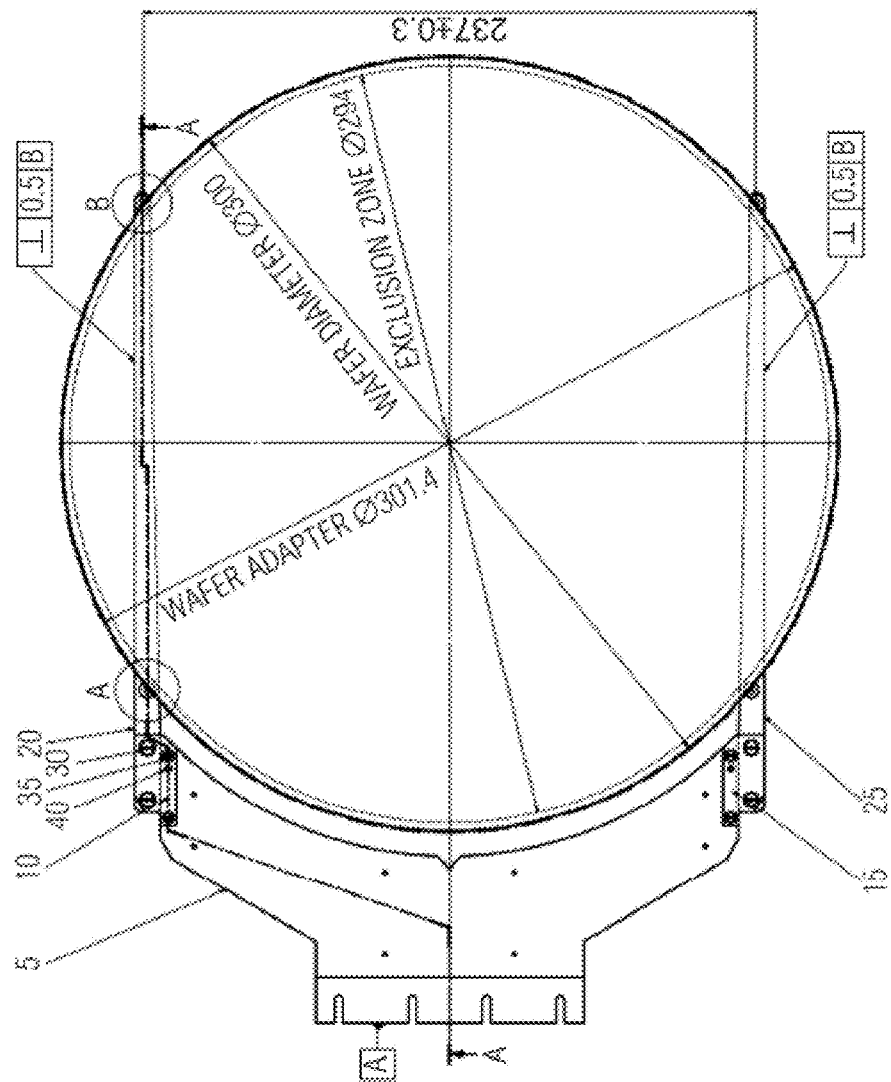
FIG. 28 illustrates 300 mm TWP vacuum End-Effector.

FIG. 28 shows a thin wafer vacuum end effector. The transfer robot needs to be configured with such units.

The degas module is one of the more critical modules in this application. To enable the module with the advanced capabilities required, the following additions to a standard degas module need to be implemented;

The substrates are mechanically clamped to a hot (150° C.) chuck with backside gas for out-gassing.

A process monitor may be mounted in direct line-of-sight of the substrate to obtain the best signal. The process monitor is used to verify the proper out-gassing state of incoming substrates and to terminate the degassing process based on the residual gas analysis. This assures that substrates are all properly and reproducibly cleaned before going to the next station.

Depending on the type of chiller used for other process modules, the degasser could be equipped with a cold trap to enhance the water pumping speeds and allow a faster degassing process.

In situ cleaning may be required. For this, an oxygen line has to be added to the gas box as well as an RF power supply train to the chuck. The process monitor can be used to monitor the cleaning process. It may be required to implement an ignition source to strike the cleaning plasma.

The substrate receiving pins may be of TWP type (4-sided arrangement).

An aspect of the eWLB capabilities is the lowering and controlling of the substrate temperature in the etch station. This is done by mechanically clamping the substrate to a cryogenic chuck as show in FIG. 29. The substrate needs to be clamped while backside is required to lower the temperature within an acceptable time and to maintain the low temperature during the etching process. The wafer has to be kept at this temperature until the first metal deposition is done.

Figure 30:
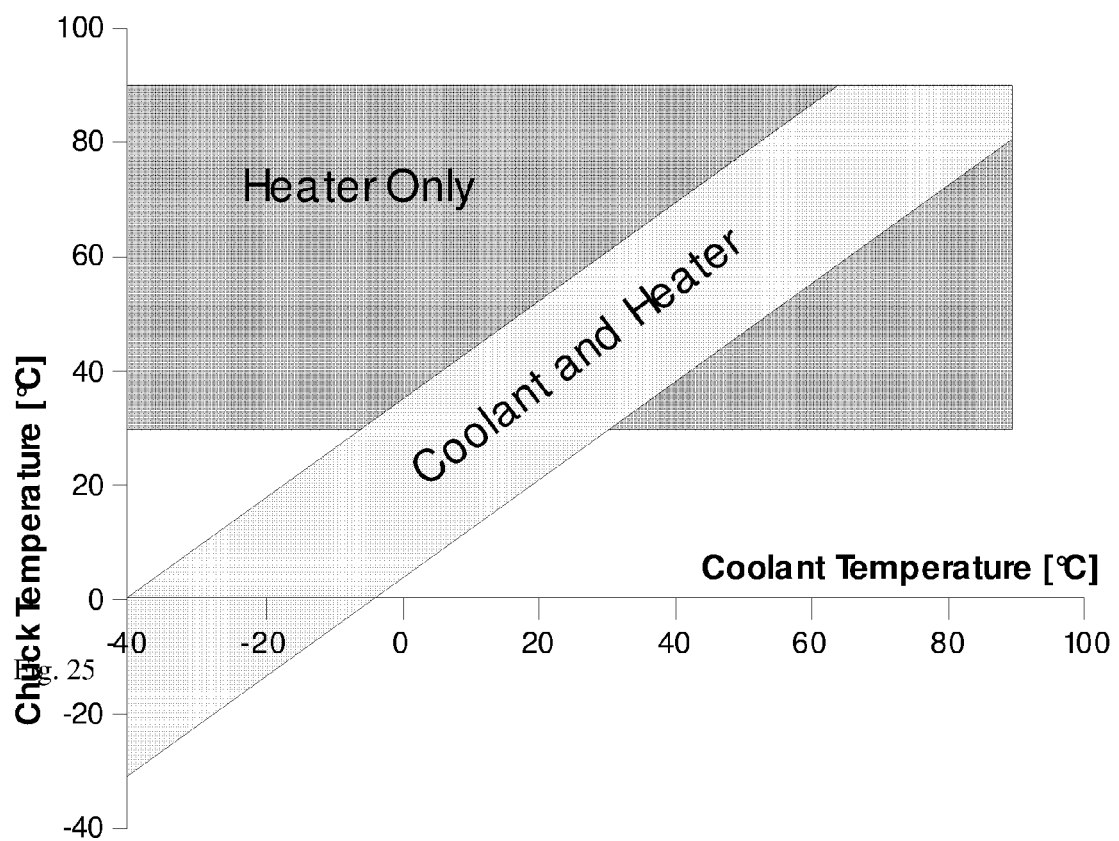
FIG. 30 illustrates control ranges of cryogenic chucks.

FIG. 30 illustrates the temperature range over which the temperature of the chuck can be controlled by using heating and/or cooling.

In addition, the etch module is typically the process station in which most organic accumulation occurs. Periodic self cleaning of the module based on reactant gas compositions is required to maintain an appropriate condition in the module In order to enable these functions, the following aspects can configured as follows.

Figure 29:
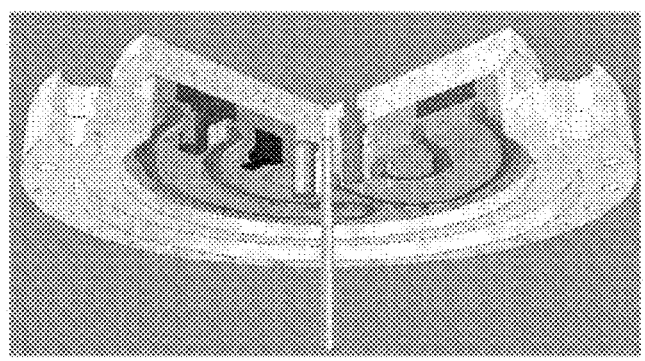
FIG. 29 illustrates a cryogenic chuck assembly.

The cryogenic chuck as shown in FIG. 29 with quartz clamping components.

An oxygen line in the gas box for in situ cleaning

A process monitor.

Advanced plasma containment shield to localize the organic deposits to areas which can be properly cleaned.

Appropriate software and hardware to allow the adaptation of the reactor pump opening during processing.

The substrate receiving pins should be of TWP type (4-sided arrangement).

Full AMS capabilities in the software to allow module priming, post process cleanup, targeted cleanup based on module state criteria and period priming/cleaning during idle times.

Time coupling between the termination of the cooling cycle in the etch chamber and the termination of deposition in the metal 1 PVD process module to assure a reproducible and minimum time between terminating the active cooling and the deposition start.

The first metal PVD module can be equipped as a standard first metal module in a standard packaging tool with the following adaptations.

A cryogenic chuck which, depending on the requirements of the subsequent processing, may be clamped with backside gas or clampless. The backside gas variation allows for a more relaxed constraint on the time coupling between etcher and metal 1, but has the drawback that no full-face deposition is possible due to the mechanical clamp.

For clampless (recessed) chucks, the backside out-gassing of the wafer may pose a problem. In case the out-gassing shows an adverse effect on the deposited film, the conduction from the wafer to the pump can be improved by specific formation of the chuck top.

The low deposition temperatures will lead to a modified stress in the deposited metal film. This can be countered by using pulsed DC sputtering or, in case more compressive films need to be made, RF bias on the chuck.

The substrate receiving pins may be of TWP type (4-sided arrangement)

Since the contamination source is capped by the metal 1 layer, further measures to handle the contamination may be omitted. Only in cases where the backside out-gassing affects the metal film quality, can similar measures as for the metal 1 clampless arrangement be implemented.

To the supporting units which normally accompany a CLN300II, a chiller unit should be added capable of reaching the required low temperatures. The effluent of this unit should be distributed to the client chuck via a distribution system.

In summary, the following software capabilities may be implemented; full Automated Maintenance Services and coupling of wafer sequences in different modules.

The measures described for contamination control and recovery are generally applicable to all substrates that show excessive out-gassing. Even standard Polyimide coated silicon wafers could be processed with much better quality and much lower maintenance efforts then is the case in standard equipment. To implement such measures in existing equipment, deployment of AMS and in situ cleaning may be used. Depending on the results for eWLB substrates of the cryogenic processes, the method may also be implemented on existing equipment.

Figure 31:
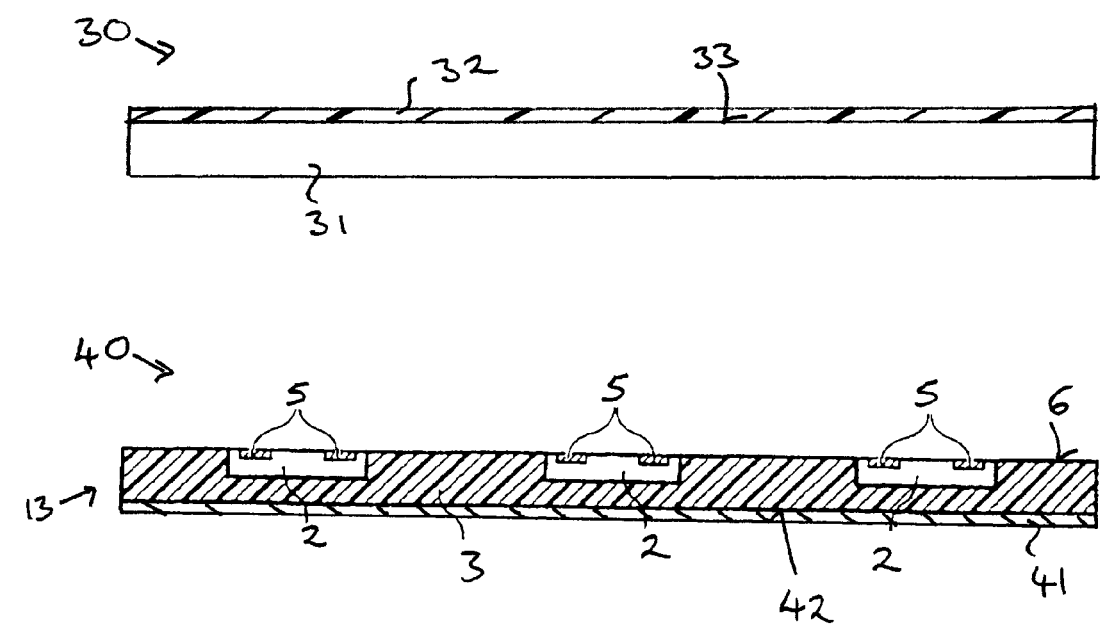
FIG. 31 illustrates different types of substrates.

FIG. 31 illustrates a substrate 30 in the form of a semiconductor wafer 31 with a layer of polyimide 32 on a major surface 33 and a substrate 40 in the form of a composite wafer 13 which further includes a metal sealing layer 41 on the rear surface 42 of the composite wafer 13.

The invention claimed is:

1. A method of processing a substrate, comprising the steps of:
providing a substrate that displays out-gassing when placed in a vacuum,
placing the substrate in a vacuum,
performing an out-gassing treatment by heating the substrate to a temperature T1 and removing gaseous contamination emitted from the substrate until the out-gassing rate is determined by the diffusion of the substrate's contamination and thus essentially a steady state has been established,
determining whether or not said essentially a steady state has been established, and
upon determining that said essentially a steady state has been established, lowering the temperature to a temperature T2 at which the diffusion rate of the substrate's contamination is lower than at T1,
further processing the substrate at said temperature T2, said further processing including depositing a film comprising a metal onto the substrate, until the substrate has been covered with the film.

2. The method according to claim 1, wherein the difference between T1 and T2 is at least 100K.

3. The method according to claim 1, wherein the substrate is maintained at a temperature of T2 or less during the further processing of the substrate.

4. The method according to claim 1, wherein the further processing of the substrate comprises one or more of etching the substrate and depositing one or more metal layers onto the substrate.

5. The method according to claim 1, wherein the substrate is a semiconductor wafer comprising a layer of organic material.

6. The method according to claim 5, wherein the organic material comprises a polyimide layer arranged on the front surface of the semiconductor wafer.

7. The method according to claim 6, wherein the semiconductor wafer is a silicon wafer.

8. The method according to claim 1, wherein at least portions of one or more of the front side and the rear side of the substrate comprise organic material.

9. The method according to claim 1, further comprising trapping gaseous matter emitted from the substrate in a cold trap positioned in a pumping line.

10. The method according to claim 1, further comprising monitoring the gaseous matter removed from the substrate and identifying presence of one or more of the compounds $CO_2$, $H_2O$, $C_xH_y$.

11. The method according to claim 1, further comprising, before depositing the first metal layer, carrying out a cleaning treatment at a temperature T2.

12. The method according to claim 11, wherein the cleaning treatment is an etching treatment.

13. The method according to claim 11, further comprising actively cooling the substrate during the cleaning treatment.

14. The method according to claim 1, further comprising actively cooling the substrate during deposition of the first metal layer.

15. The method according to claim 1, further comprising depositing a second metal layer on the first metal layer and, optionally, a third metal layer on the second metal layer.

16. The method according to claim 1, further comprising depositing a sealing metal layer on the rear side of the substrate before depositing the first metal layer on the front side of the substrate.

17. A method of producing an electronic component, comprising performing the method of one of claims 1 to 16, and singulating the substrate to produce one or more electronic components, the electronic component comprising a semiconductor chip embedded in a plastic composition and at least one metal layer positioned on at least one of the semiconductor chip and on the plastic composition.

18. The method according to claim 1, wherein steps of performing the out-gassing treatment, lowering the temperature to a temperature T2, and further processing the substrate at said temperature T2 including depositing the film comprising the metal onto the substrate, are performed using a cluster-type multi-station processing apparatus.

19. A method of processing a substrate, comprising the steps of:

providing a substrate that displays out-gassing when placed in a vacuum, placing the substrate in a vacuum, performing an out-gassing treatment by heating the substrate to a temperature T1 and removing gaseous contamination emitted from the substrate until the out-gassing rate is determined by the diffusion of the substrate's contamination and thus essentially a steady state has been established, and afterwards lowering the temperature to a temperature T2 at which the diffusion rate of the substrate's contamination is lower than at T1, further processing the substrate at said temperature T2, said further processing including depositing a film comprising a metal onto the substrate, until the substrate has been covered with the film, wherein the temperature of the substrate is directly lowered from temperature T1 to temperature T2 without intermediate heating.

20. The method according to claim 19, wherein no intermediate processing of the substrate occurs while the temperature of the substrate is directly lowered from temperature T1 to temperature T2.

21. A method of processing a substrate, comprising the steps of:

providing a substrate that displays out-gassing when placed in a vacuum, placing the substrate in a vacuum, performing an out-gassing treatment by heating the substrate to a temperature T1 and removing gaseous contamination emitted from the substrate until the out-gassing rate is determined by the diffusion of the substrate's contamination and thus essentially a steady state has been established, and afterwards lowering the temperature to a temperature T2 at which the diffusion rate of the substrate's contamination is lower than at T1, further processing the substrate at said temperature T2, said further processing including depositing a film comprising a metal onto the substrate, until the substrate has been covered with the film, wherein no intermediate processing of the substrate occurs during the step of lowering the temperature to the temperature T2.

* * * * *